United States Patent
Brooks et al.

(10) Patent No.: US 9,413,325 B2
(45) Date of Patent: Aug. 9, 2016

(54) SWITCHLESS MULTIBAND FILTER ARCHITECTURE

(71) Applicants: Time Warner Cable Enterprises LLC, New York, NY (US); Cable Television Laboratories, Inc., Louisville, CO (US)

(72) Inventors: Paul Brooks, Weddington, NC (US); Belal Hamzeh, Westminster, CO (US)

(73) Assignees: TIME WARNER CABLE ENTERPRISES LLC, New York, NY (US); CABLE TELEVISION LABORATORIES, INC., Louisville, CO (US)

( * ) Notice: Subject to any disclaimer, the term of this patent is extended or adjusted under 35 U.S.C. 154(b) by 0 days.

(21) Appl. No.: 14/321,496

(22) Filed: Jul. 1, 2014

(65) Prior Publication Data
US 2016/0006407 A1    Jan. 7, 2016

(51) Int. Cl.
*H04M 11/06*    (2006.01)
*H03H 7/01*    (2006.01)

(52) U.S. Cl.
CPC .................... *H03H 7/0138* (2013.01)

(58) Field of Classification Search
USPC .......................................... 375/222; 455/333
See application file for complete search history.

(56) References Cited

U.S. PATENT DOCUMENTS

| 5,068,574 | A | * | 11/1991 | Koda et al. ..................... 315/225 |
| 6,456,186 | B1 | * | 9/2002 | Oglesbee ....................... 337/161 |
| 7,792,963 | B2 | | 9/2010 | Gould et al. |
| 2002/0159436 | A1 | | 10/2002 | Adachi |
| 2003/0056217 | A1 | | 3/2003 | Brooks |
| 2004/0198298 | A1 | * | 10/2004 | Waight et al. .................. 455/333 |
| 2006/0130107 | A1 | | 6/2006 | Gonder et al. |
| 2007/0217436 | A1 | | 9/2007 | Markley et al. |
| 2009/0248794 | A1 | | 10/2009 | Helms |
| 2010/0313236 | A1 | | 12/2010 | Straub |
| 2014/0036744 | A1 | | 2/2014 | Zeng et al. |

FOREIGN PATENT DOCUMENTS

WO    WO2014022132 A1    2/2014

OTHER PUBLICATIONS

Keith Jack & Vladimir Tsatsulin, Dictionary of Video and Television Technology (excerpt), 2002, Elsevier, 7 pages.

Richard W. Kroon, A/V A to Z: An Encyclopedic Dictionary of Media, Entertainment and Other Audiovisual Terms (excerpt), 2010, McFarland & Company, Inc., 5 pages.

Anon., Wikipedia article "Cable Modem" pp. 1-8 downloaded Jun. 24, 2014 from http://en.wikipedia.org/wiki/Cable_modem.

Anon., Data Over Cable Service Interface Specifications DOCSIS 3.0 Physical Layer Specification CM-SP-PHYv3.0-I01-060804 pp. i-viii and 1-156, Cable Television Laboratories, Inc., Aug. 4, 2006.

(Continued)

*Primary Examiner* — Eva Puente

(74) *Attorney, Agent, or Firm* — Otterstedt, Ellenbogen & Kammer, LLP

(57) ABSTRACT

A cable modem is provided in a premises. The cable modem is operated in a first mode with a first upstream passband. At least one fusible link in the cable modem is caused to be blown, which in turn causes the cable modem to upgrade to a second mode with a second upstream passband, greater than the first upstream passband, without use of any switch.

20 Claims, 21 Drawing Sheets

(56) References Cited

OTHER PUBLICATIONS

Anon., Wikipedia article "Diplexer" pp. 1-3 downloaded Feb. 27, 2014 from http://en.wikipedia.org/wiki/Diplexer.

Anon., Wikipedia article "DOCSIS" pp. 1-5 downloaded Apr. 4, 2014 from http://en.wikipedia.org/wiki/DOCSIS.

Curt Franklin, HowStuffWorks "How Cable Modems Work"—A Discovery Company, pp. 1-3, downloaded Jun. 24, 2014 from http://computer.howstuffworks.com/cable-modem.htm/printable.

Anon., Wikipedia article "Programmable Logic Device" pp. 1-7 downloaded Feb. 27, 2014 from http://en.wikipedia.org/wiki/Programmable_logic_device.

* cited by examiner

SWITCHLESS MULTIBAND FILTER ARCHITECTURE

FIELD OF THE INVENTION

The present invention relates generally to communications systems and methods, and, more particularly, to cable modem architecture and the like.

BACKGROUND OF THE INVENTION

Until fairly recently, the cable network was predominantly a vehicle for delivering entertainment. With the advent of the Internet and the rise in demand for broadband two-way access, the cable industry began to seek new ways of utilizing its existing plant. Pure coaxial ("coax") cable networks were replaced with hybrid fiber networks (HFNs) using optical fiber from the head end to the demarcation with the subscriber coax (usually at a fiber node). Currently, a content-based network, a non-limiting example of which is a cable television network, may afford access to a variety of services besides television, for example, broadband Internet access, telephone service, and the like.

One significant issue for a cable operator desiring to provide digital service is the configuration of its network. Designed for one-way delivery of broadcast signals, the existing cable network topology was optimized for downstream only (i.e., towards the subscriber) service. New equipment had to be added to the network to provide two-way communication. To reduce the cost of this equipment and to simplify the upgrade of the broadcast cable for two-way digital traffic, standards were developed for a variety of new cable-based services. The first of these standards, the Data Over Cable System Interface Standard (DOCSIS® standard), was released in 1998. DOCSIS® establishes standards for cable modems and supporting equipment. DOCSIS® (Data Over Cable Service Interface Specification) is a registered mark of Cable Television Laboratories, Inc., 400 Centennial Parkway Louisville Colo. 80027, USA, and will be referred to for the remainder of this application in capital letters, without the ® symbol, for convenience.

The DOCSIS architecture includes a cable modem (CM) located at the customer premises, and a cable modem termination system (CMTS) located at the head end. A typical CMTS is a device which hosts downstream and upstream ports.

Table 5-2 of Data Over Cable Service Interface Specifications DOCSIS 3.0 Physical Layer Specification CM-SP-PHYv3.0-I01-060804, dated Aug. 4, 2006, lists the Assumed Upstream RF (radio frequency) Channel Frequency range as 5 to 42 MHz edge to edge or 5 to 85 MHz edge to edge. Nevertheless, a viable and cost-effective solution to provide variable upstream frequency range has heretofore not been available.

SUMMARY OF THE INVENTION

Principles of the present invention provide switchless multiband filter architecture(s) and related method(s). In one aspect, an exemplary apparatus includes an input port; an output port; a low-pass filter connected between the input port and the output port; a bandpass filter; and an inverter structure connected in series with the bandpass filter. The series-connected inverter structure and bandpass filter are connected in parallel with the low-pass filter between the input port and the output port. The inverter structure in turn includes a transmission line; and an inverter connected in parallel with the transmission line by at least one fusible link without the use of any switch. Also included is a controller coupled to the at least one fusible link. The inverter structure, the bandpass filter, and the at least one fusible link, are configured, and the controller is configurable, such that signals of a first frequency range, equal to a passband of the low-pass filter, are passed from the input port to the output port under a first condition when the at least one fusible link is intact, and such that signals of a second frequency range, equal to the passband of the low-pass filter plus a passband of the bandpass filter, are passed from the input port to the output port under a second condition when the at least one fusible link is caused to be blown by the controller.

In another aspect, another exemplary apparatus includes an input port; an output port; a full-band low-pass filter connected between the input port and the output port; N bandpass filters, N being an integer at least equal to one; and N inverters connected in series with the N bandpass filters by N at least one fusible links without the use of any switch. The N series-connected inverters and bandpass filters are connected in parallel with the full-band low-pass filter between the input port and the output port. Also included is a controller coupled to the N at least one fusible links. The N inverters, the N bandpass filters, and the N at least one fusible links are configured, and the controller is configurable, such that signals of a first frequency range, equal to a passband of the full-band low-pass filter less a combined passband of the N bandpass filters, are passed from the input port to the output port under a first condition when the N at least one fusible links are intact, and such that signals of a second frequency range, equal to the passband of the full-band low-pass filter, are passed from the input port to the output port under a second condition when the N at least one fusible links are caused to be blown by the controller.

In a further aspect, an exemplary method includes providing a cable modem in a premises; operating the cable modem in a first mode with a first upstream passband; and causing at least one fusible link in the cable modem to blow, to in turn cause the cable modem to upgrade to a second mode with a second upstream passband, greater than the first upstream passband, without use of any switch.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

At least a portion of one or more embodiments of the invention, or elements thereof, can be implemented in the form of an article of manufacture including a machine readable medium that contains one or more programs which when executed implement one or more method steps set forth herein; that is to say, a computer program product including a tangible computer readable recordable storage medium (or multiple such media) with computer usable program code for performing the method steps indicated. Furthermore, at least a portion of one or more embodiments of the invention or elements thereof can be implemented in the form of an apparatus including a memory and at least one processor that is coupled to the memory and operative to perform, or facilitate performance of, exemplary method steps. Yet further, in another aspect, at least a portion of one or more embodiments of the invention or elements thereof can be implemented in the form of means for carrying out one or more of the method steps described herein; the means can include (i) specialized hardware module(s), (ii) software module(s) stored in a tangible computer-readable recordable storage medium (or multiple such media) and implemented on a hardware processor, or (iii) a combination of (i) and (ii); any of (i)-(iii) implement the specific techniques set forth herein. The means do not include a transmission medium per se or a disembodied signal per se.

Techniques of the present invention can provide substantial beneficial technical effects. For example, one or more embodiments provide dramatic cost reduction for cable modems with multiple upstream bands These and other features and advantages of the present invention will become apparent from the following detailed description of illustrative embodiments thereof, which is to be read in connection with the accompanying drawings.

DETAILED DESCRIPTION OF PREFERRED EMBODIMENTS

Figure 1:
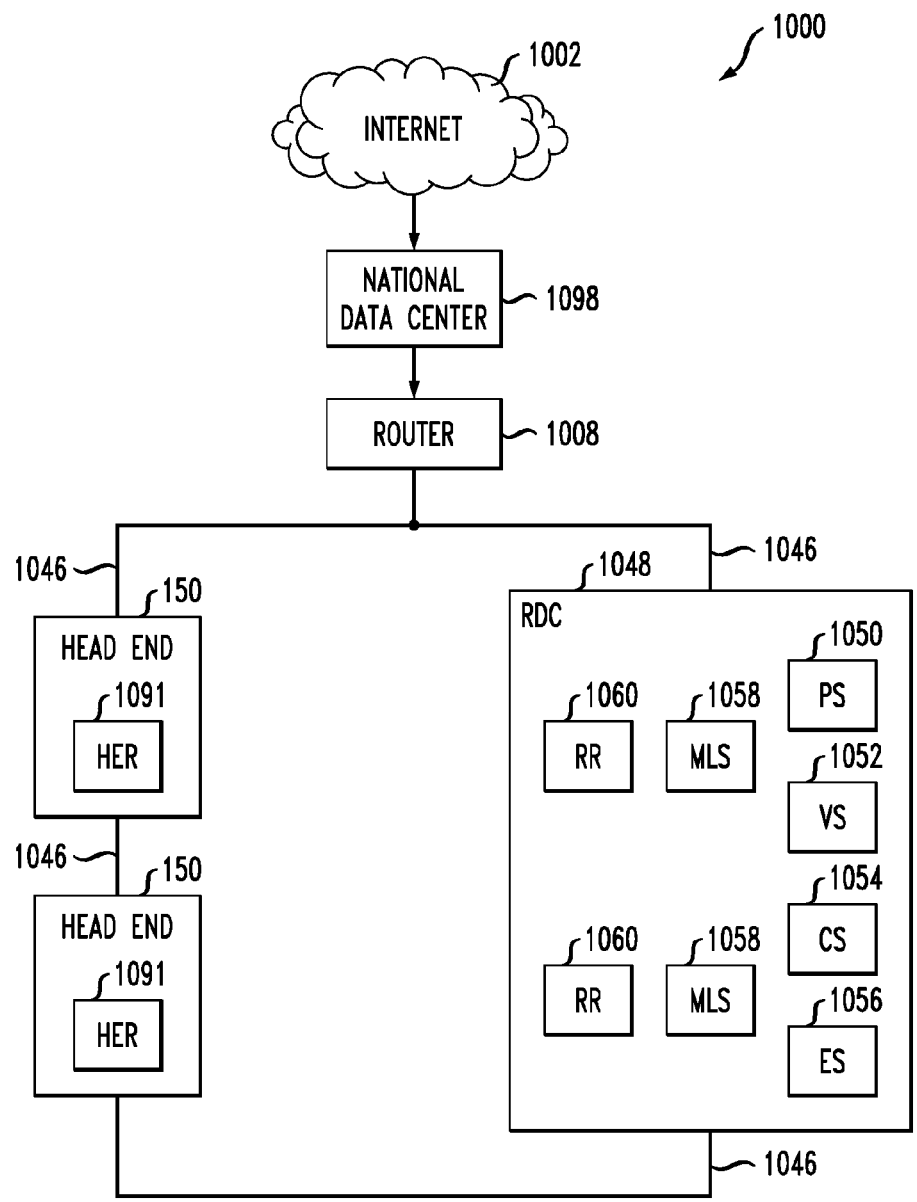
FIG. 1 is a block diagram of an exemplary embodiment of a system, within which one or more aspects of the invention can be implemented.

As noted, IP-based data services may be provided over a variety of networks. Purely by way of example and not limitation, some embodiments will be shown in the context of a cable multi-service operator (MSO) providing data services as well as entertainment services. FIG. 1 shows an exemplary system 1000, according to an aspect of the invention. System 1000 includes a regional data center (RDC) 1048, and one or more divisions, represented by division head ends 150. RDC 1048 and head ends 150 are interconnected by a network 1046; by way of example and not limitation, a dense wavelength division multiplex (DWDM) network. Elements 1048, 150 on network 1046 may be operated, for example, by or on behalf of a cable MSO, and may be interconnected with a global system of interconnected computer networks that use the standardized Internet Protocol Suite (TCP/IP)(transfer control protocol/Internet protocol), commonly called the Internet 1002; for example, via router 1008. In one or more non-limiting exemplary embodiments, router 1008 is a point-of-presence ("POP") router; for example, of the kind available from Juniper Networks, Inc., Sunnyvale, Calif., USA. Head ends 150 may each include a head end router (HER) 1091 which interfaces with network 1046. Head end routers 1091 are omitted from figures below to avoid clutter.

RDC 1048 may include one or more provisioning servers (PS) 1050, one or more Video Servers (VS) 1052, one or more content servers (CS) 1054, and one or more e-mail servers (ES) 1056. The same may be interconnected to one or more RDC routers (RR) 1060 by one or more multi-layer switches (MLS) 1058. RDC routers 1060 interconnect with network 1046.

A national data center (NDC) 1098 is provided in some instances; for example, between router 1008 and Internet 1002. In one or more embodiments, such an NDC may consolidate at least some functionality from head ends and/or regional data centers. For example, such an NDC might include one or more VOD servers; switched digital video (SDV) functionality; gateways to obtain content (e.g., program content) from various sources including cable feeds and/or satellite; and so on.

Figure 2:
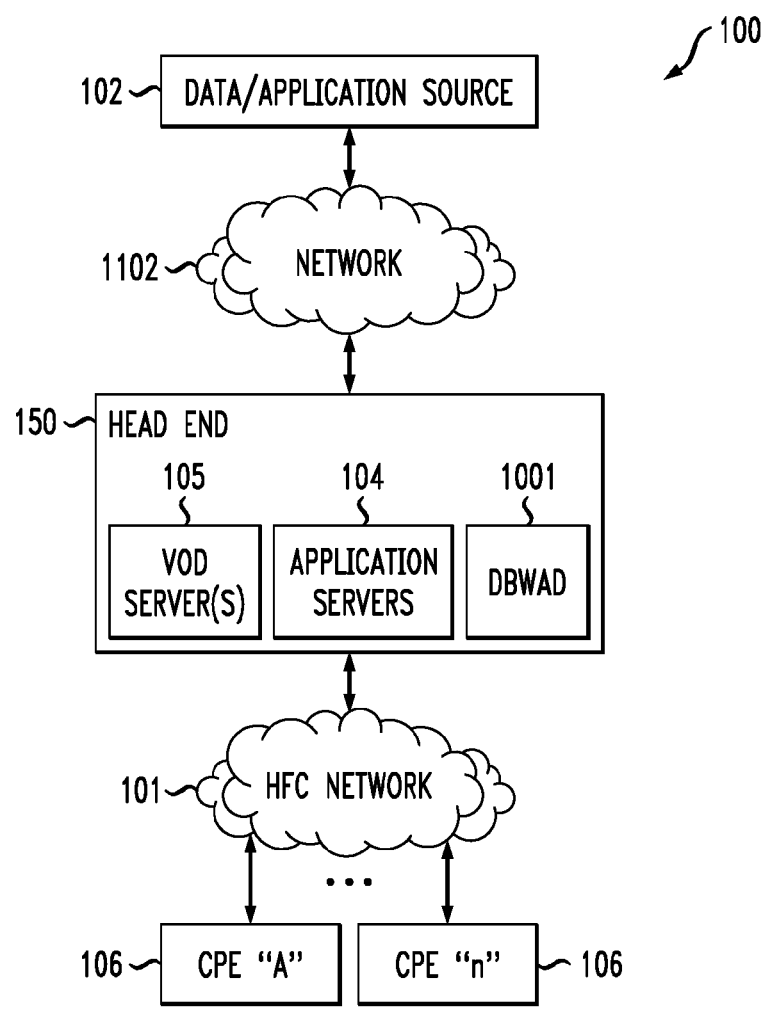
FIG. 2 is a functional block diagram illustrating an exemplary hybrid fiber-coaxial (HFC) divisional network configuration, useful within the system of FIG. 1.

FIG. 2 is a functional block diagram illustrating an exemplary content-based (e.g., hybrid fiber-coaxial (HFC)) divisional network configuration, useful within the system of FIG. 1. See, for example, US Patent Publication 2006/0130107 of Gonder et al., entitled "Method and apparatus for high bandwidth data transmission in content-based networks," the complete disclosure of which is expressly incorporated by reference herein in its entirety for all purposes. The various components of the network 100 include (i) one or more data and application origination points 102; (ii) one or more application distribution servers 104; (iii) one or more video-on-demand (VOD) servers 105, and (v) consumer premises equipment or customer premises equipment (CPE) 106. The distribution server(s) 104, VOD servers 105 and CPE(s) 106 are connected via a bearer (e.g., HFC) network 101. Servers 104, 105 can be located in head end 150. A simple architecture is shown in FIG. 2 for illustrative brevity, although it will be recognized that comparable architectures with multiple origination points, distribution servers, VOD servers, and/or CPE devices (as well as different network topologies) may be utilized consistent with embodiments of the invention. For example, the head-end architecture of FIG. 3 (described in greater detail below) may be used.

The data/application origination point 102 comprises any medium that allows data and/or applications (such as a VOD-based or "Watch TV" application) to be transferred to a distribution server 104, for example, over network 1102. This can include for example a third party data source, application vendor website, compact disk read-only memory (CD-ROM), external network interface, mass storage device (e.g., Redundant Arrays of Inexpensive Disks (RAID) system), etc. Such transference may be automatic, initiated upon the occurrence of one or more specified events (such as the receipt of a request packet or acknowledgement (ACK)), performed manually, or accomplished in any number of other modes readily recognized by those of ordinary skill, given the teachings herein. For example, in one or more embodiments, network 1102 may correspond to network 1046 of FIG. 1, and the data and application origination point may be, for example, within NDC 1098, RDC 1048, or on the Internet 1002. Head end 150, HFC network 101, and CPEs 106 thus represent the divisions which were represented by division head ends 150 in FIG. 1.

The application distribution server 104 comprises a computer system where such applications can enter the network system. Distribution servers per se are well known in the networking arts, and accordingly not described further herein.

The VOD server 105 comprises a computer system where on-demand content can be received from one or more of the aforementioned data sources 102 and enter the network system. These servers may generate the content locally, or alternatively act as a gateway or intermediary from a distant source.

The CPE 106 includes any equipment in the "customers' premises" (or other appropriate locations) that can be accessed by a distribution server 104 or a cable modem termination system 156 (discussed below with regard to FIG. 3). Non-limiting examples of CPE are set-top boxes and high-speed cable modems for providing high bandwidth Internet access in premises such as homes and businesses.

Also included (for example, in head end 150) is a dynamic bandwidth allocation device (DBWAD) 1001 such as a global session resource manager, which is itself a non-limiting example of a session resource manager.

Figure 3:
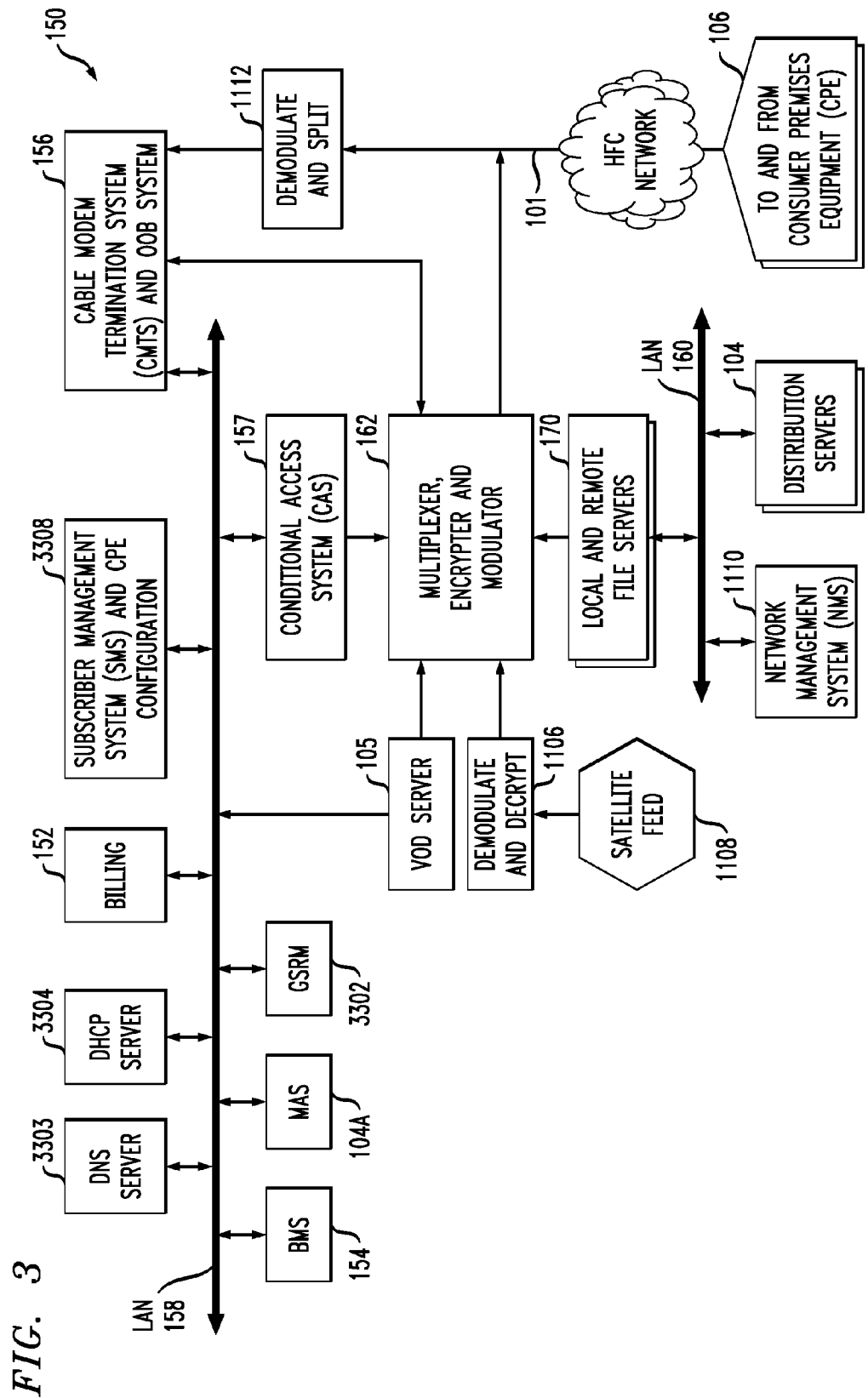
FIG. 3 is a functional block diagram illustrating one exemplary HFC cable network head-end configuration, useful within the system of FIG. 1.

FIG. 3 is a functional block diagram illustrating one exemplary HFC cable network head-end configuration, useful within the system of FIG. 1. As shown in FIG. 3, the head-end architecture 150 comprises typical head-end components and services including billing module 152, subscriber management system (SMS) and CPE configuration management module 3308, cable-modem termination system (CMTS) and out-of-band (OOB) system 156, as well as LAN(s) 158, 160 placing the various components in data communication with one another. In one or more embodiments, there are multiple CMTSs. Each may be coupled to an HER 1091, for example. See, e.g., FIGS. 1 and 2 of co-assigned U.S. Pat. No. 7,792,963 of inventors Gould and Danforth, entitled METHOD TO BLOCK UNAUTHORIZED NETWORK TRAFFIC IN A CABLE DATA NETWORK, the complete disclosure of which is expressly incorporated herein by reference in its entirety for all purposes.

It will be appreciated that while a bar or bus LAN topology is illustrated, any number of other arrangements (e.g., ring, star, etc.) may be used consistent with the invention. It will also be appreciated that the head-end configuration depicted in FIG. 3 is high-level, conceptual architecture and that each multi-service operator (MSO) may have multiple head-ends deployed using custom architectures.

The architecture 150 of FIG. 3 further includes a multiplexer/encrypter/modulator (MEM) 162 coupled to the HFC network 101 adapted to "condition" content for transmission over the network. The distribution servers 104 are coupled to the LAN 160, which provides access to the MEM 162 and network 101 via one or more file servers 170. The VOD servers 105 are coupled to the LAN 158, although other architectures may be employed (such as for example where the VOD servers are associated with a core switching device such as an 802.3z Gigabit Ethernet device; or the VOD servers could be coupled to LAN 160). Since information is typically carried across multiple channels, the head-end should be adapted to acquire the information for the carried channels from various sources. Typically, the channels being delivered from the head-end 150 to the CPE 106 ("downstream") are multiplexed together in the head-end and sent to neighborhood hubs (refer to description of FIG. 4) via a variety of interposed network components.

Content (e.g., audio, video, etc.) is provided in each downstream (in-band) channel associated with the relevant service group. (Note that in the context of data communications, internet data is passed both downstream and upstream.) To communicate with the head-end or intermediary node (e.g., hub server), the CPE 106 may use the out-of-band (OOB) or DOCSIS® (Data Over Cable Service Interface Specification) channels (registered mark of Cable Television Laboratories, Inc., 400 Centennial Parkway Louisville Colo. 80027, USA) and associated protocols (e.g., DOCSIS 1.x, 2.0, 3.0, or 3.1). The OpenCable™ Application Platform (OCAP) 1.0, 2.0, 3.0 (and subsequent) specification (Cable Television laboratories Inc.) provides for exemplary networking protocols both downstream and upstream, although the invention is in no way limited to these approaches. All versions of the DOCSIS and OCAP specifications are expressly incorporated herein by reference in their entireties for all purposes. Furthermore, Data Over Cable Service Interface Specifications DOCSIS 3.0 Physical Layer Specification CM-SP-PHYv3.0-I01-060804, dated Aug. 4, 2006; Data-Over-Cable Service Interface Specifications DOCSIS® 3.1, Physical Layer Specification, CM-SP-PHYv3.1-I02-140320; and Data-Over-Cable Service Interface Specifications DOCSIS® 3.1, Physical Layer Specification, CM-SP-PHYv3.1-I03-140610 are all expressly incorporated herein by reference in their entireties for all purposes.

Furthermore in this regard, DOCSIS is an international telecommunications standard that permits the addition of high-speed data transfer to an existing cable TV (CATV) system. It is employed by many cable television operators to provide Internet access (cable Internet) over their existing hybrid fiber-coaxial (HFC) infrastructure. Use of DOCSIS to transmit data on an HFC system is one non-limiting exemplary application of one or more embodiments. However, one or more embodiments are generally applicable to IP transport of data, regardless of what kind of functionality is employed.

It will also be recognized that multiple servers (broadcast, VOD, or otherwise) can be used, and disposed at two or more different locations if desired, such as being part of different server "farms". These multiple servers can be used to feed one service group, or alternatively different service groups. In a simple architecture, a single server is used to feed one or more service groups. In another variant, multiple servers located at the same location are used to feed one or more service groups. In yet another variant, multiple servers disposed at different location are used to feed one or more service groups.

In some instances, material may also be obtained from a satellite feed 1108; such material is demodulated and decrypted in block 1106 and fed to block 162. Conditional access system 157 may be provided for access control purposes. Network management system 1110 may provide appropriate management functions. Note also that signals from MEM 162 and upstream signals from network 101 that have been demodulated and split in block 1112 are fed to CMTS and OOB system 156.

Also included in FIG. 3 are a global session resource manager (GSRM) 3302, a Mystro Application Server 104A, and a business management system 154, all of which are coupled to LAN 158. GSRM 3302 is one specific form of a DBWAD 1001 and is a non-limiting example of a session resource manager.

An ISP DNS server could be located in the head-end as shown at 3303, but it can also be located in a variety of other places. One or more DHCP server(s) 3304 can also be located where shown or in different locations.

Figure 4:
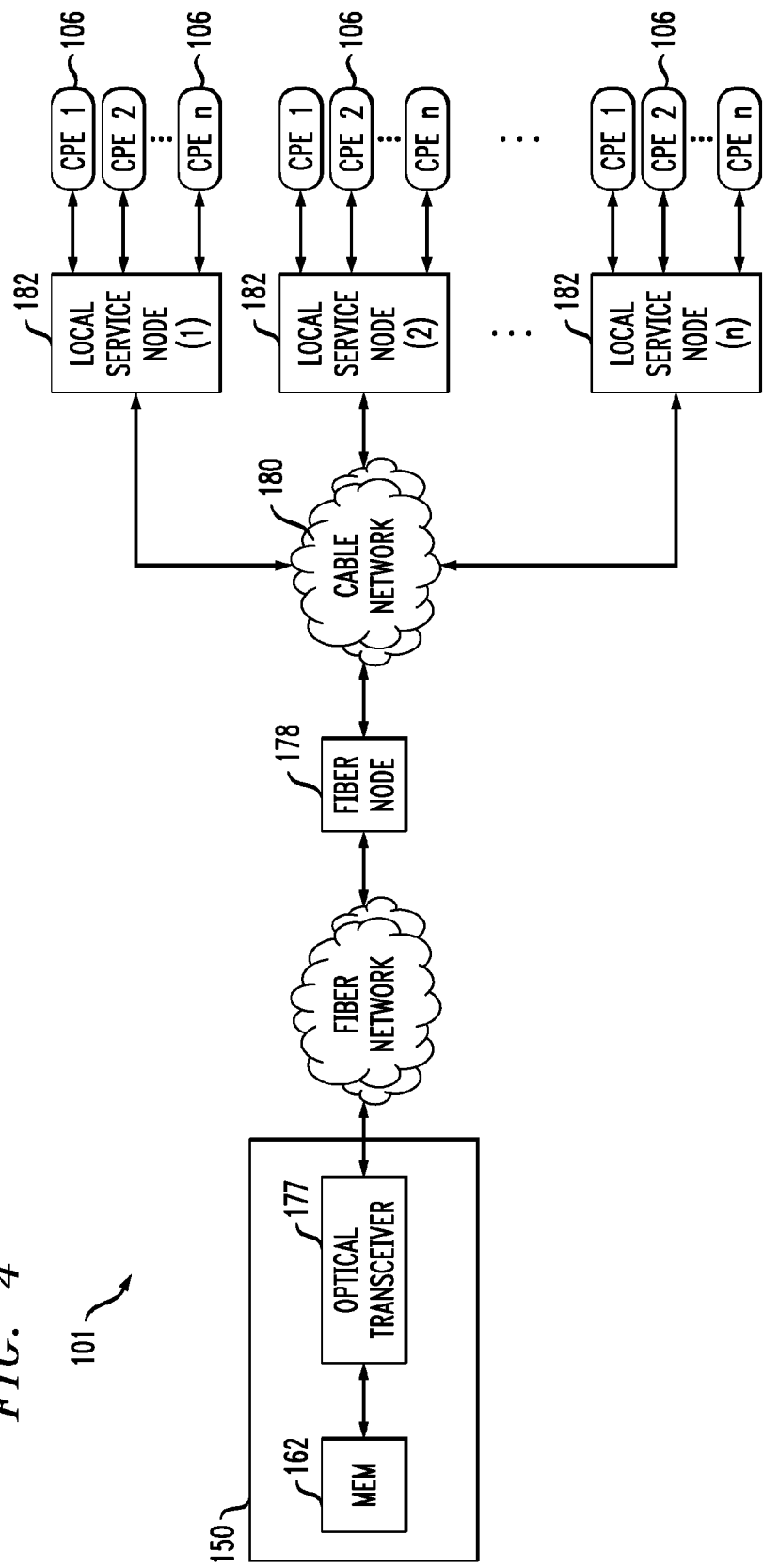
FIG. 4 is a functional block diagram illustrating one exemplary local service node configuration useful within the system of FIG. 1.

As shown in FIG. 4, the network 101 of FIGS. 2 and 3 comprises a fiber/coax arrangement wherein the output of the MEM 162 of FIG. 3 is transferred to the optical domain (such as via an optical transceiver 177 at the head-end 150 or further downstream). The optical domain signals are then distributed over a fiber network to a fiber node 178, which further distributes the signals over a distribution network 180 (typically coax) to a plurality of local servicing nodes 182. This provides an effective 1-to-N expansion of the network at the local service end. Each node 182 services a number of CPEs 106. Further reference may be had to US Patent Publication 2007/0217436 of Markley et al., entitled "Methods and apparatus for centralized content and data delivery," the complete disclosure of which is expressly incorporated herein by reference in its entirety for all purposes. In one or more embodiments, the CPE 106 includes a cable modem, such as a DOCSIS-compliant cable modem (DCCM). Please note that the number of CPE 106 per node 182 may be different than the number of nodes 182.

Certain additional aspects of video or other content delivery will now be discussed for completeness, it being understood that embodiments of the invention have broad applicability to filter architectures. Again, delivery of data over a video (or other) content network is but one non-limiting example of a context where one or more embodiments could be implemented. US Patent Publication 2003-0056217 of Paul D. Brooks, entitled "Technique for Effectively Providing Program Material in a Cable Television System," the complete disclosure of which is expressly incorporated herein by reference for all purposes, describes one exemplary broadcast switched digital architecture, although it will be recognized by those of ordinary skill that other approaches and architectures may be substituted. In a cable television system in accordance with the Brooks invention, program materials are made available to subscribers in a neighborhood on an as needed basis. Specifically, when a subscriber at a set-top terminal selects a program channel to watch, the selection request is transmitted to a head end of the system. In response to such a request, a controller in the head end determines whether the material of the selected program channel has been made available to the neighborhood. If it has been made available, the controller identifies to the set-top terminal the carrier which is carrying the requested program material, and to which the set-top terminal tunes to obtain the requested program material. Otherwise, the controller assigns an unused carrier to carry the requested program material, and informs the set-top terminal of the identity of the newly assigned carrier. The controller also retires those carriers assigned for the program channels which are no longer watched by the subscribers in the neighborhood. Note that reference is made herein, for brevity, to features of the "Brooks invention"—it should be understood that no inference should be drawn that such features are necessarily present in all claimed embodiments of Brooks. The Brooks invention is directed to a technique for utilizing limited network bandwidth to distribute program materials to subscribers in a community access television (CATV) system. In accordance with the Brooks invention, the CATV system makes available to subscribers selected program channels, as opposed to all of the program channels furnished by the system as in prior art. In the Brooks CATV system, the program channels are provided on an as needed basis, and are selected to serve the subscribers in the same neighborhood requesting those channels.

US Patent Publication 2010-0313236 of Albert Straub, entitled "TECHNIQUES FOR UPGRADING SOFTWARE IN A VIDEO CONTENT NETWORK," the complete disclosure of which is expressly incorporated herein by reference for all purposes, provides additional details on the aforementioned dynamic bandwidth allocation device 1001.

US Patent Publication 2009-0248794 of William L. Helms, entitled "SYSTEM AND METHOD FOR CONTENT SHARING," the complete disclosure of which is expressly incorporated herein by reference for all purposes, provides additional details on CPE in the form of a converged premises gateway device. Related aspects are also disclosed in US Patent Publication 2007-0217436 of Markley et al, entitled "METHODS AND APPARATUS FOR CENTRALIZED CONTENT AND DATA DELIVERY," the complete disclosure of which is expressly incorporated herein by reference for all purposes. One or more embodiments are broadly applicable to CPE including cable modem(s) in premises, with or without other CPE functionality.

Figure 5:
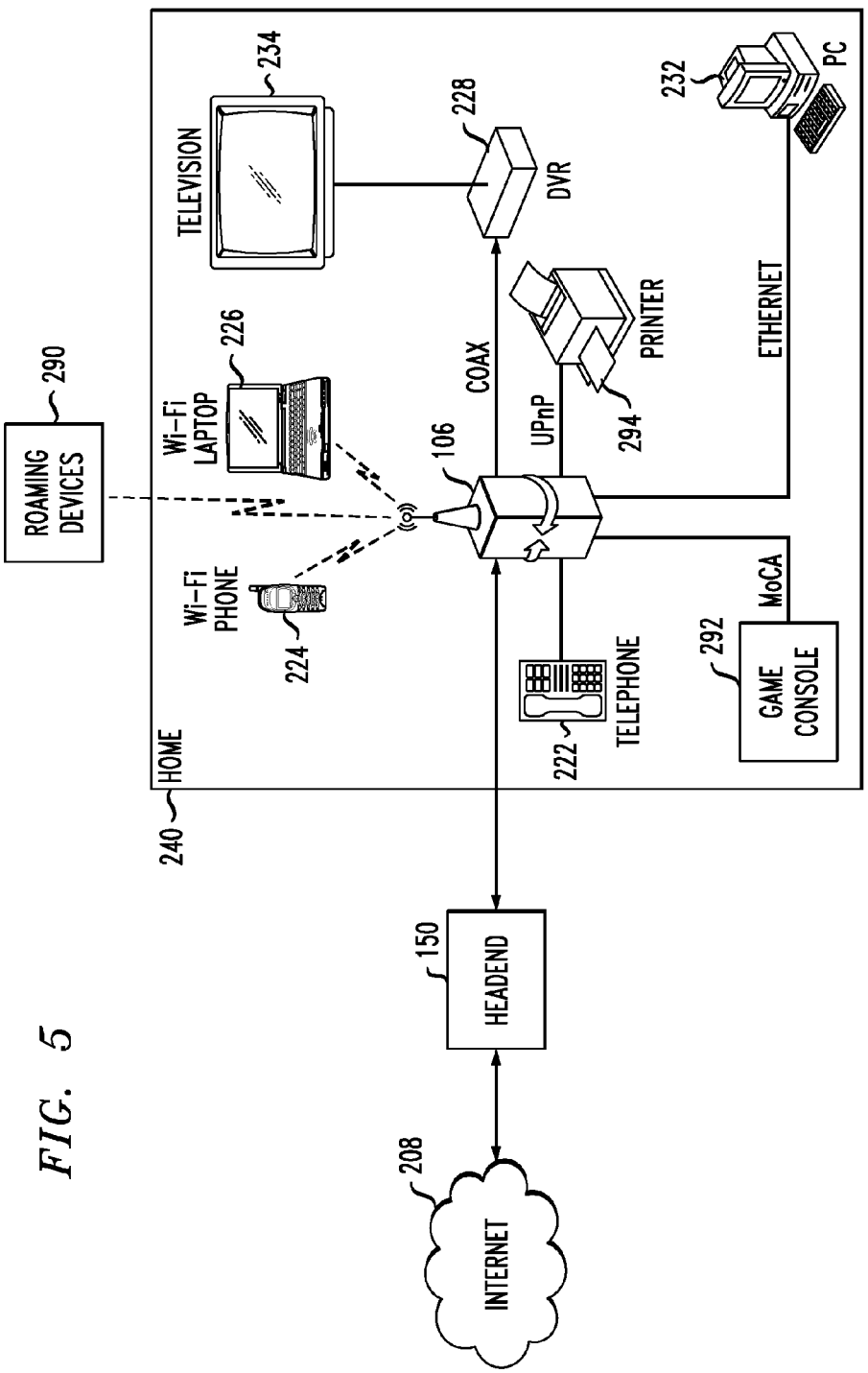
FIG. 5 is a functional block diagram of a premises network, including an exemplary centralized customer premises equipment (CPE) unit, interfacing with a head end such as that of FIG. 3.
Figure 6:
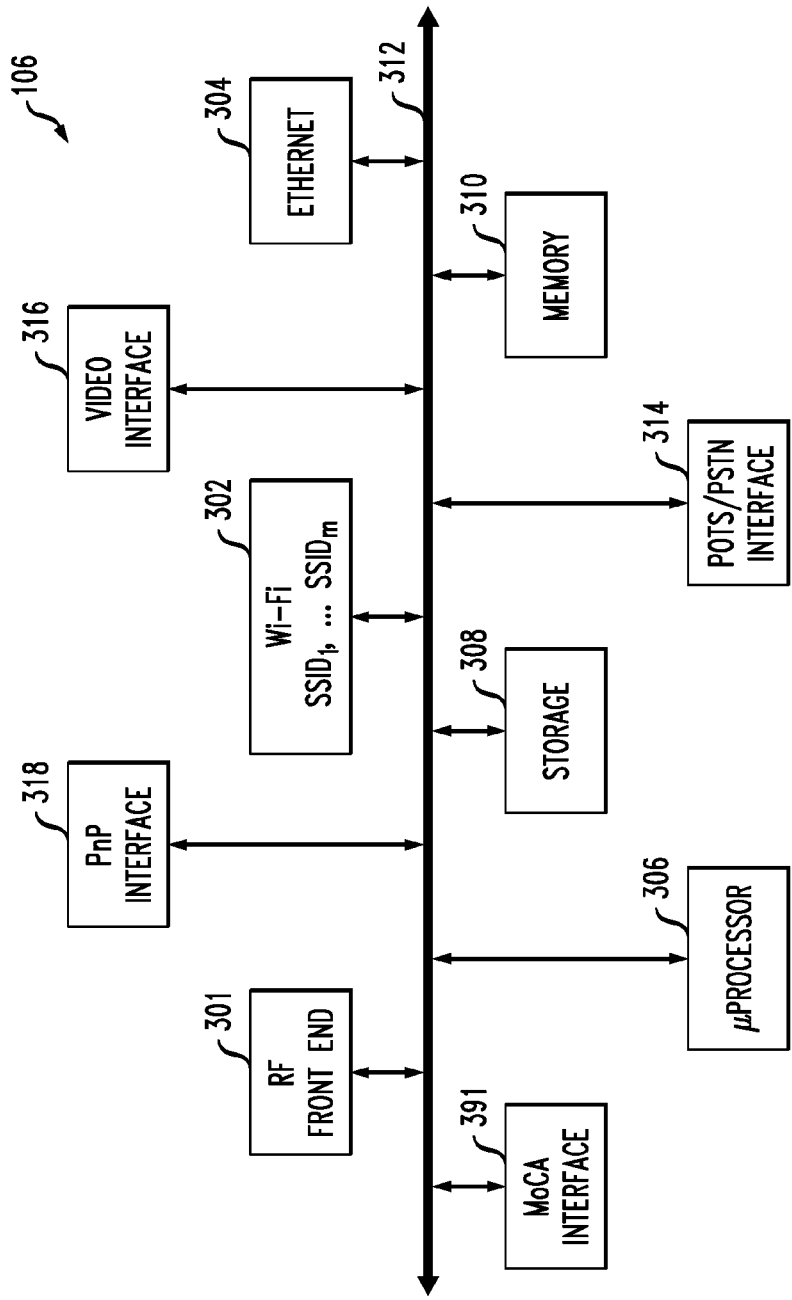
FIG. 6 is a functional block diagram of an exemplary centralized CPE unit, useful within the system of FIG. 1.

Reference should now be had to FIG. 5, which presents a block diagram of a premises network interfacing with a head end of an MSO or the like, providing Internet access. An exemplary advanced wireless gateway comprising CPE 106 is depicted as well. It is to be emphasized that the specific form of CPE 106 shown in FIGS. 5 and 6 is exemplary and non-limiting, and shows a number of optional features. Many other types of CPE can be employed in one or more embodiments; for example, a DOCSIS cable modem using inventive filtering architecture described below with or without the other functionality depicted in FIGS. 5 and 6, DSL modem, and the like. It should be noted that while one or more exemplary embodiments are presented in the context of DOCSIS, other embodiments provide a filter architecture that is more generic in nature and potentially applicable to other technologies as well.

Exemplary CPE 106 includes an advanced wireless gateway which connects to a head end 150 or other hub of a network, such as a video content network of an MSO or the like. The head end is coupled also to an internet (e.g., the Internet) 208 which is located external to the head end 150, such as via an Internet (IP) backbone or gateway (not shown).

The head end is in the illustrated embodiment coupled to multiple households or other premises, including the exemplary illustrated household 240. In particular, the head end (for example, a cable modem termination system 156 thereof) is coupled via the aforementioned HFC network and local coaxial cable or fiber drop to the premises, including the consumer premises equipment (CPE) 106. The exemplary CPE 106 is in signal communication with any number of different devices including, e.g., a wired telephony unit 222, a Wi-Fi or other wireless-enabled phone 224, a Wi-Fi or other wireless-enabled laptop 226, a session initiation protocol (SIP) phone, an H.323 terminal or gateway, etc. Additionally, the CPE 106 is also coupled to a digital video recorder (DVR) 228 (e.g., over coax), in turn coupled to television 234 via a wired or wireless interface (e.g., cabling, PAN or 802.15 UWB micro-net, etc.). CPE 106 is also in communication with a network (here, an Ethernet network compliant with IEEE Std. 802.3, although any number of other network protocols and topologies could be used) on which is a personal computer (PC) 232.

Other non-limiting exemplary devices that CPE 106 may communicate with include a printer 294; for example over a universal plug and play (UPnP) interface, and/or a game console 292; for example, over a multimedia over coax alliance (MoCA) interface.

In some instances, CPE 106 is also in signal communication with one or more roaming devices, generally represented by block 290.

A "home LAN" (HLAN) is created in the exemplary embodiment, which may include for example the network formed over the installed coaxial cabling in the premises, the Wi-Fi network, and so forth.

During operation, the CPE 106 exchanges signals with the head end over the interposed coax (and/or other, e.g., fiber) bearer medium. The signals include e.g., Internet traffic (IPv4 or IPv6), digital programming and other digital signaling or content such as digital (packet-based; e.g., VoIP) telephone service. The CPE 106 then exchanges this digital information after demodulation and any decryption (and any demultiplexing) to the particular system(s) to which it is directed or addressed. For example, in some cases, a MAC address or IP address can be used as the basis of directing traffic within the client-side environment 240.

Any number of different data flows may occur within the network depicted in FIG. 5. For example, the CPE 106 may exchange digital telephone signals from the head end which are further exchanged with the telephone unit 222, the Wi-Fi phone 224, or one or more roaming devices 290. The digital telephone signals may be IP-based such as Voice-over-IP (VoIP), or may utilize another protocol or transport mechanism. The well known session initiation protocol (SIP) may be used, for example, in the context of a "SIP phone" for making multi-media calls. The network may also interface with a cellular or other wireless system, such as for example a 3G IMS (IP multimedia subsystem) system, in order to provide multimedia calls between a user or consumer in the household domain 240 (e.g., using a SIP phone or H.323 terminal) and a mobile 3G telephone or personal media device (PMD) user via that user's radio access network (RAN).

The CPE 106 may also exchange Internet traffic (e.g., TCP/IP and other packets) with the head end 150 which is further exchanged with the Wi-Fi laptop 226, the PC 232, one or more roaming devices 290, or other device. CPE 106 may also receive digital programming that is forwarded to the DVR 228 or to the television 234. Programming requests and other control information may be received by the CPE 106 and forwarded to the head end as well for appropriate handling.

FIG. 6 is a block diagram of one exemplary embodiment of the CPE 106 of FIG. 5. The exemplary CPE 106 includes an RF front end 301, Wi-Fi interface 302, video interface 316, "Plug n' Play" (PnP) interface 318 (for example, a UPnP interface) and Ethernet interface 304, each directly or indirectly coupled to a bus 312. In some cases, Wi-Fi interface 302 comprises a single wireless access point (WAP) running multiple ("m") service set identifiers (SSIDs). In some cases, multiple SSIDs, which could represent different applications, are served from a common WAP. For example, SSID 1 is for the home user, while SSID 2 may be for a managed security service, SSID 3 may be a managed home networking service, SSID 4 may be a hot spot, and so on. Each of these is on a separate IP subnetwork for security, accounting, and policy reasons. The microprocessor 306, storage unit 308, plain old telephone service (POTS)/public switched telephone network (PSTN) interface 314, and memory unit 310 are also coupled to the exemplary bus 312, as is a suitable MoCA interface 391. The memory unit 310 typically comprises a random access memory (RAM) and storage unit 308 typically comprises a hard disk drive, an optical drive (e.g., CD-ROM or DVD), NAND flash memory, RAID (redundant array of inexpensive disks) configuration, or some combination thereof.

The illustrated CPE 106 can assume literally any discrete form factor, including those adapted for desktop, floor-standing, or wall-mounted use, or alternatively may be integrated in whole or part (e.g., on a common functional basis) with other devices if desired.

Again, it is to be emphasized that every embodiment need not necessarily have all the elements shown in FIG. 6—as noted, the specific form of CPE 106 shown in FIGS. 5 and 6 is exemplary and non-limiting, and shows a number of optional features. Yet again, many other types of CPE can be employed in one or more embodiments; for example, a cable modem, DSL modem, and the like.

It will be recognized that while a linear or centralized bus architecture is shown as the basis of the exemplary embodiment of FIG. 6, other bus architectures and topologies may be used. For example, a distributed or multi-stage bus architecture may be employed. Similarly, a "fabric" or other mechanism (e.g., crossbar switch, RAPIDIO interface, non-blocking matrix, TDMA or multiplexed system, etc.) may be used as the basis of at least some of the internal bus communications within the device. Furthermore, many if not all of the foregoing functions may be integrated into one or more integrated circuit (IC) devices in the form of an ASIC or "system-on-a-chip" (SoC). Myriad other architectures well known to those in the data processing and computer arts may accordingly be employed.

Yet again, it will also be recognized that the CPE configuration shown is essentially for illustrative purposes, and various other configurations of the CPE 106 are consistent with other embodiments of the invention. For example, the CPE 106 in FIG. 6 may not include all of the elements shown, and/or may include additional elements and interfaces such as for example an interface for the HomePlug A/V standard which transmits digital data over power lines, a PAN (e.g., 802.15), Bluetooth, or other short-range wireless interface for localized data communication, etc.

A suitable number of standard 10/100/1000 Base T Ethernet ports for the purpose of a Home LAN connection are provided in the exemplary device of FIG. 6; however, it will be appreciated that other rates (e.g., Gigabit Ethernet or 10-Gig-E) and local networking protocols (e.g., MoCA, USB, etc.) may be used. These interfaces may be serviced via a WLAN interface, wired RJ-45 ports, or otherwise. The CPE 106 can also include a plurality of RJ-11 ports for telephony interface, as well as a plurality of USB (e.g., USB 2.0) ports, and IEEE-1394 (Firewire) ports. S-video and other signal interfaces may also be provided if desired.

During operation of the CPE 106, software located in the storage unit 308 is run on the microprocessor 306 using the memory unit 310 (e.g., a program memory within or external to the microprocessor). The software controls the operation of the other components of the system, and provides various other functions within the CPE. Other system software/firmware may also be externally reprogrammed, such as using a download and reprogramming of the contents of the flash memory, replacement of files on the storage device or within other non-volatile storage, etc. This allows for remote reprogramming or reconfiguration of the CPE 106 by the MSO or other network agent.

The RF front end 301 of the exemplary embodiment comprises a cable modem of the type known in the art. In some cases, the CPE just includes the cable modem and omits one, some, or all of the optional features. Content or data normally streamed over the cable modem can be received and distributed by the CPE 106, such as for example packetized video (e.g., IPTV). The digital data exchanged using RF front end 301 includes IP or other packetized protocol traffic that provides access to internet service. As is well known in cable modem technology, such data may be streamed over one or more dedicated QAMs resident on the HFC bearer medium, or even multiplexed or otherwise combined with QAMs allocated for content delivery, etc. The packetized (e.g., IP) traffic received by the CPE 106 may then be exchanged with other digital systems in the local environment 240 (or outside this environment by way of a gateway or portal) via, e.g. the Wi-Fi interface 302, Ethernet interface 304 or plug-and-play (PnP) interface 318.

Additionally, the RF front end 301 modulates, encrypts/multiplexes as required, and transmits digital information for receipt by upstream entities such as the CMTS or a network server. Digital data transmitted via the RF front end 301 may include, for example, MPEG-2 encoded programming data that is forwarded to a television monitor via the video interface 316. Programming data may also be stored on the CPE storage unit 308 for later distribution by way of the video interface 316, or using the Wi-Fi interface 302, Ethernet interface 304, Firewire (IEEE Std 1394), USB/USB2, or any number of other such options.

Other devices such as portable music players (e.g., MP3 audio players) may be coupled to the CPE 106 via any number of different interfaces, and music and other media files downloaded for portable use and viewing.

In some instances, the CPE 106 includes a DOCSIS cable modem for delivery of traditional broadband Internet services. This connection can be shared by all Internet devices in the premises 240; e.g. Internet protocol television (IPTV) devices, PCs, laptops, etc., as well as by roaming devices 290. In addition, the CPE 106 can be remotely managed (such as from the head end 150, or another remote network agent) to support appropriate IP services.

In some instances the CPE 106 also creates a home Local Area Network (LAN) utilizing the existing coaxial cable in the home. For example, an Ethernet-over-coax based technology allows services to be delivered to other devices in the home utilizing a frequency outside (e.g., above) the traditional cable service delivery frequencies. For example, frequencies on the order of 1150 MHz could be used to deliver data and applications to other devices in the home such as PCs, PMDs, media extenders and set-top boxes. The coaxial network is merely the bearer; devices on the network utilize Ethernet or other comparable networking protocols over this bearer.

The exemplary CPE 106 shown in FIGS. 5 and 6 acts as a Wi-Fi access point (AP), thereby allowing Wi-Fi enabled devices to connect to the home network and access Internet, media, and other resources on the network. This functionality can be omitted in one or more embodiments.

In one embodiment, Wi-Fi interface 302 comprises a single wireless access point (WAP) running multiple ("m") service set identifiers (SSIDs). One or more SSIDs can be set aside for the home network while one or more SSIDs can be set aside for roaming devices 290.

A premises gateway software management package (application) is also provided to control, configure, monitor and provision the CPE 106 from the cable head-end 150 or other remote network node via the cable modem (DOCSIS) interface. This control allows a remote user to configure and monitor the CPE 106 and home network.

The MoCA interface 391 can be configured, for example, in accordance with the MoCA 1.0, 1.1, or 2.0 specifications.

As discussed above, the optional Wi-Fi wireless interface 302 is, in some instances, also configured to provide a plurality of unique service set identifiers (SSIDs) simultaneously. These SSIDs are configurable (locally or remotely), such as via a web page.

In addition to "broadcast" content (e.g., video programming), the systems of FIGS. 1-6 also deliver Internet data services using the Internet protocol (IP), although other protocols and transport mechanisms of the type well known in the digital communication art may be substituted. The IP packets are typically transmitted on RF channels that are different that the RF channels used for the broadcast video and audio programming, although this is not a requirement. The CPE 106 are each configured to monitor the particular assigned RF channel (such as via a port or socket ID/address, or other such mechanism) for IP packets intended for the subscriber premises/address that they serve.

One issue faced by DOCSIS cable modems (CMs) is the support of multiple upstream bands based on the network profile. For example, based on the network, the upstream band can be any of the following: 5-42 MHz, 5-65 MHz, 5-85 MHz, 5-108 MHz, or 5-204 MHz. Additionally, a network can be upgraded from one band to another to increase the available spectrum available for upstream traffic. For the avoidance of doubt, in FIG. 5, upstream traffic refers to traffic from one or more devices in the home 240 or other premises that is sent upstream from the cable modem (e.g., in CPE 106) to the head end 150 or other upstream node in the network.

To support multiple bands or upgrades from one band to another, with current techniques, a cable modem would have to implement a switchable diplex filter, which introduces significant cost in the design. Additionally, when MSOs upgrade a network, they typically migrate to a larger upstream band from a smaller upstream band and not vice-versa.

One or more embodiments provide an upstream filter architecture that enables upgrading from one band to another, without the need for a switchable diplex filter. In one or more embodiments, the filter architecture includes a low pass filter, placed in parallel with band-appropriate band pass filters, in either an additive signal architecture or a subtractive signal architecture. For example, in one non-limiting example, a 42 MHz cable modem (CM) upgradeable to 85 MHz includes a 42 MHz low pass filter and a 42-85 MHz band pass filter in an additive signal architecture, or includes an 85 MHz low pass filter and a 42-85 MHz band pass filter in a subtractive signal architecture.

Additive Signal Architecture

Figure 8:
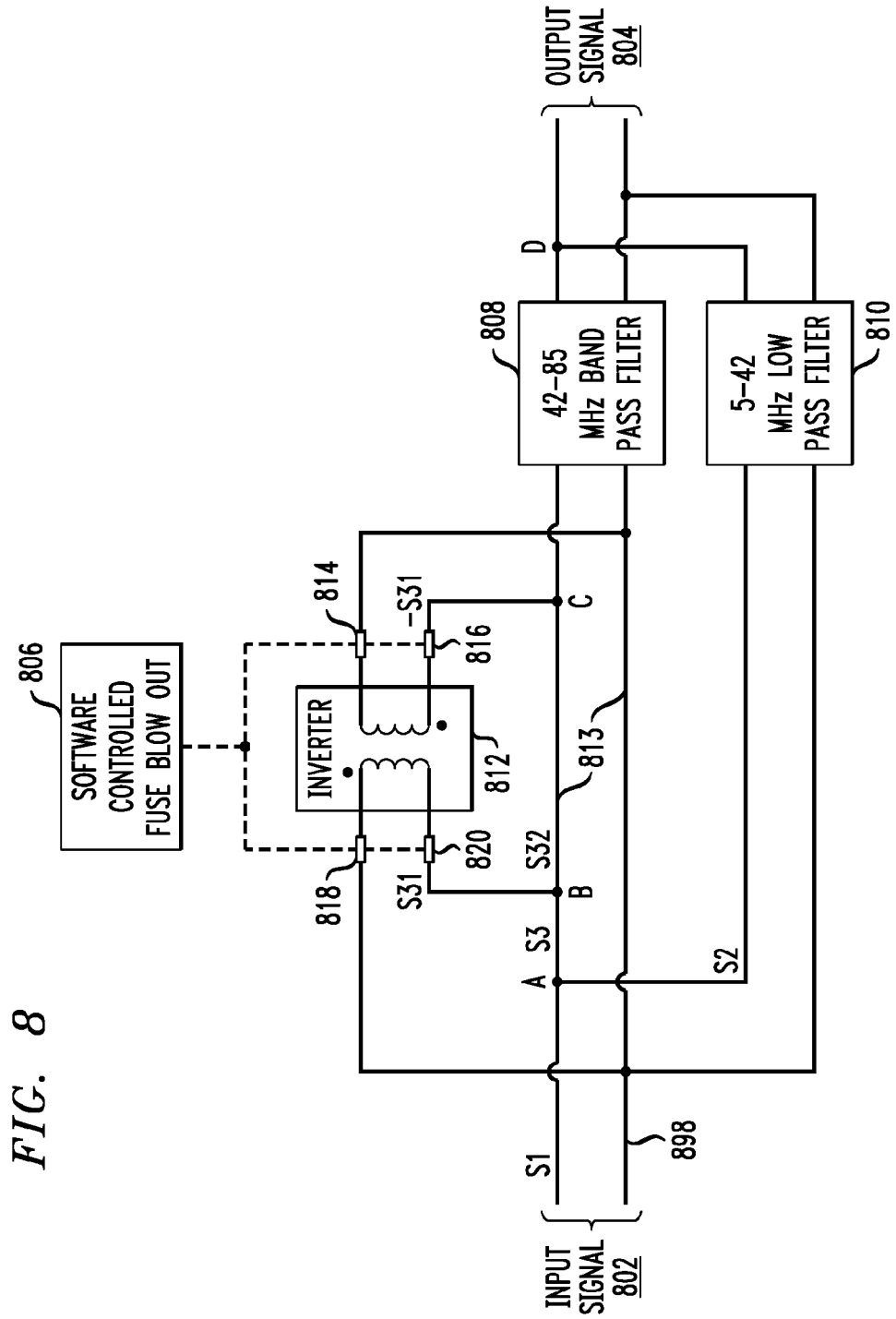
FIG. 8 shows an exemplary specific additive signal architecture, in accordance with an aspect of the invention.

FIG. 8 shows an example of an additive signal architecture. The input signal S1, numbered 802, is split into two signals S2 and S3 at point A. Line 898 is a ground (reference line). The input signal could include, for example, a signal from a cable modem of CPE 106 upstream to the head end. S2 passes to the low-pass filter (LPF) 810 (in this non-limiting example, a 5-42 MHz LPF), and S3 passes to the bandpass filter (BPF)

bank 808 (in this non-limiting example, a single 42-85 MHz BPF). When the architecture of FIG. 8 is configured to operate in 42 MHz mode, S3 is split at point B into S31 and S32. S31 passes through an inverter 812, producing −S31 (i.e., S31 inverted or 180 degrees out of phase with S31) which recombines with S32 at point C where they cancel out, and thus no signal is passing through the band pass filter 808 in 42 MHz mode. The output signal 804 from point D is then S2, which is a 5-42 MHz signal. When the filter is upgraded to operate in the 85 MHz mode, the fuses 814, 816, 818, 820 shown in FIG. 8 are blown out via software, where a high voltage is commanded to pass through the line to cause the fuse blowout. This is shown at block 806 which represents, for example, a high-voltage supply switchable to cause a large current to pass through fuses 814, 816, 818, 820, causing them to melt (blow) and opening the circuits. The software could include instructions stored in storage 308 loaded into memory 310 which cause processor 306 to activate the high-voltage supply to blow the fuses. In one or more embodiments, element 806 is a logic controller that would typically reside in the CM, and which uses a voltage source within the CM. Furthermore in this regard, CMs are traditionally designed with programmable voltage sources; in one or more embodiments, one of these programmable voltage sources is programmed to provide a high voltage to blow the fusible links. Other embodiments could use a different approach, such as a dedicated high voltage source, if desired. In a non-limiting example, the fuses are blown in response to a firmware upgrade; any suitable initiating mechanism can be employed to cause the fuses to be blown. With the fuses blown out, the inverter 812 is effectively taken out of the circuit, and then S2 passes through the LPF 810, S32=S3 passes through the BPF 808 and recombines with S2 at point D producing output signal 804 which is now a 5-85 MHz signal.

Figure 9:
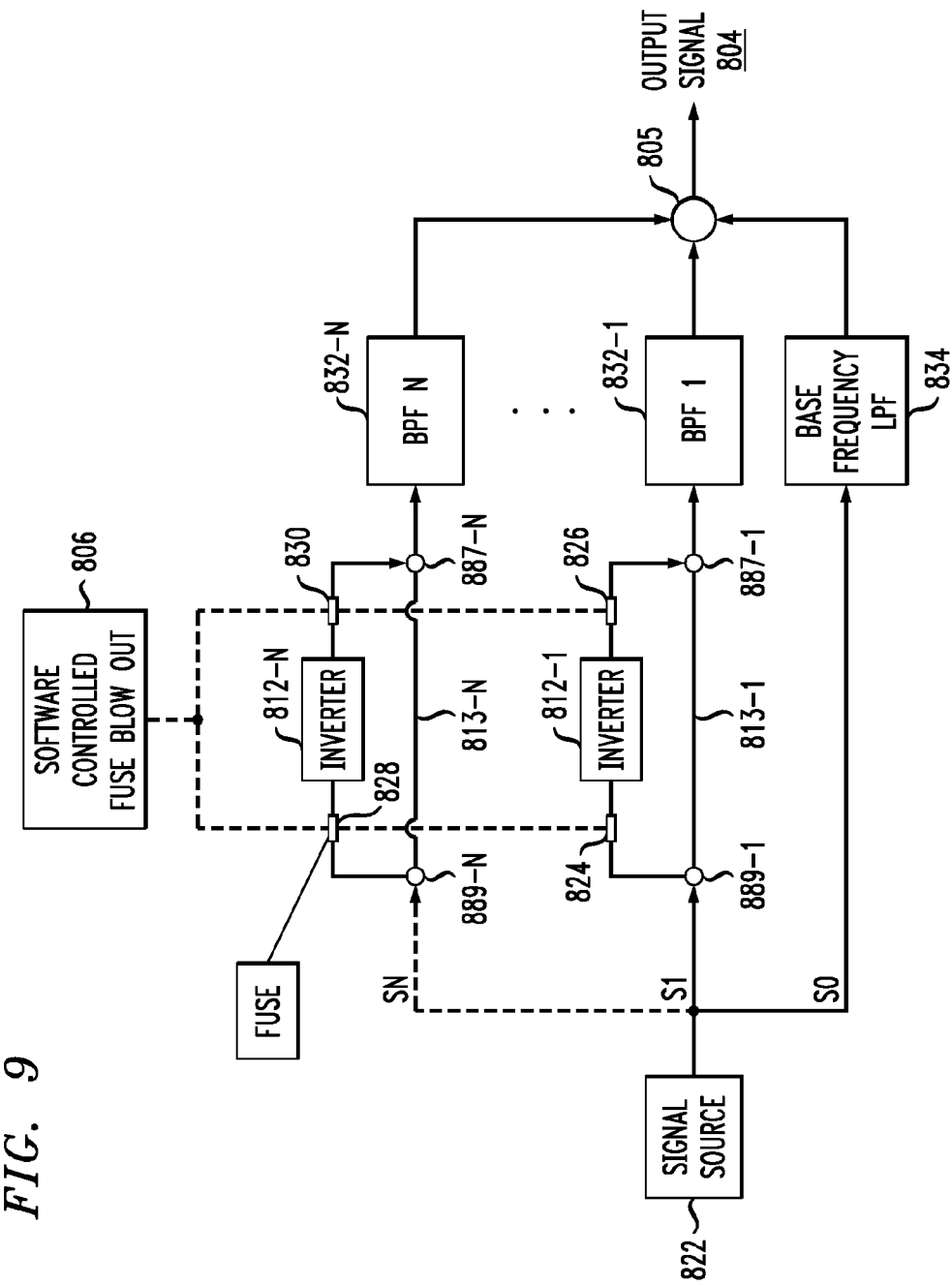
FIG. 9 shows an exemplary generalized additive signal architecture, in accordance with an aspect of the invention.

FIG. 9 shows a generalized implementation for the additive signal architecture of FIG. 8, where multiple upgrades can be supported. Elements similar to those in FIG. 8 have received the same reference character except that S1 in FIG. 8 represents an input signal divided into S2 and S3 while S1 in FIG. 9 represents one of N+1 signals into which an input signal is divided. Also, the ground (reference line) is omitted in FIG. 9 to avoid clutter. In particular, the input signal from signal source 822 is split into N+1 signals S0, S1, . . . , SN. Again, the input signal could include, for example, a signal from a cable modem of CPE 106 upstream to the head end. S0 passes to the base-frequency low-pass filter (LPF) 834, and each of the N remaining signals S1, . . . , SN passes, respectively, to bandpass filters 1 through N numbered 832-1 through 832-N. When the architecture of FIG. 9 is configured to operate in a first mode, the signal to each of the bandpass filters 832-1 through 832-N is split at 889-1, . . . , 889-N and inverted in a corresponding inverter 812-1 through 812-N, producing a negative (i.e., inverted or 180 degrees out of phase) signal which recombines with the original signal at 887-1, . . . , 887-N where they cancel out, and thus no signal is passing through the band pass filters 812-1 through 812-N in the first mode. The output signal 804 is then simply S0 as filtered by the LPF 834.

When the architecture of FIG. 9 undergoes a first upgrade to operate with a higher upstream bandwidth the fuses 824, 826 shown in FIG. 9 are blown out via software, where a high voltage is commanded to pass through the line to cause the fuse blowout. This is shown at block 806, for example, discussed above. With the fuses 824, 826 blown out, the inverter 812-1 is effectively taken out of the circuit, and then S1 passes to the BPF 832-1 and recombines with S0 as filtered by the LPF 834 at 805, producing output signal 804 which now has a higher bandwidth including the passband of the original LPF 834 plus the passband of the BPF 1 832-1.

This process can be repeated by blowing the fuses associated with the inverter for each successive BPF; thus, in a final upgrade, the fuses 828, 830 shown in FIG. 9 are blown out via software, where a high voltage is commanded to pass through the line to cause the fuse blowout. This is shown at block 806, for example, discussed above. With the fuses 828, 830 blown out, the inverter 812-N is effectively taken out of the circuit, and then signal SN passes to the BPF 832-N and recombines at 805 with S0 as filtered by the LPF 834, as well as with the signals passing through the other BPFs producing output signal 804 which now has a still higher bandwidth including the passband of the original LPF 834 plus the passbands of the BPFs 1 through N 832-1 through 832-N.

Figure 10:
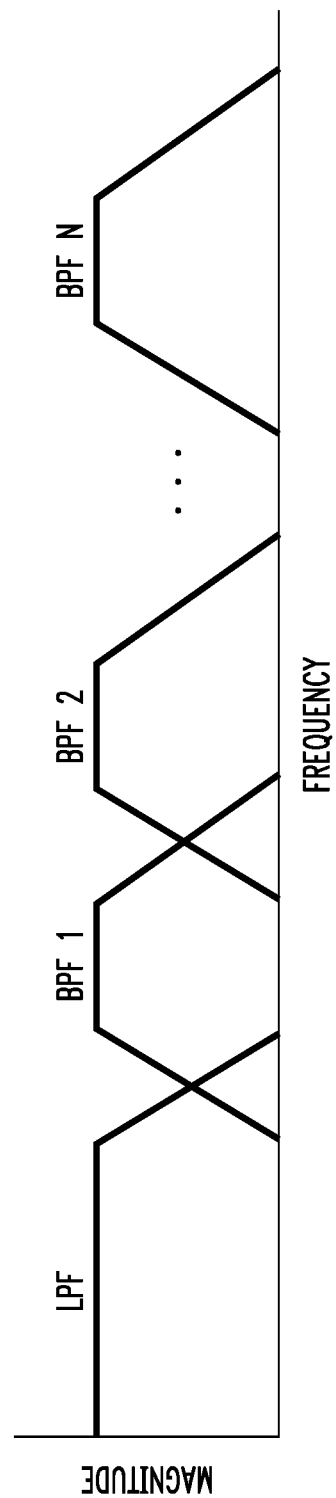
FIG. 10 shows pass-bands of a low-pass filter and a plurality of band-pass filters, of the exemplary generalized additive signal architecture of FIG. 9, in accordance with an aspect of the invention.

Examples of the LPF and BPFs are shown in FIG. 10. In particular, initially, with all the inverters 812-1 through 812-N in-line, the overall passband is simply that of the LPF 834. When the fuses 824, 826 are blown, the overall passband is that of the LPF 834 plus BPF 1 832-1, and so on until the fuses 828, 830 are blown, and the overall passband is that of the LPF 834 plus BPF 1 832-1 through BPF N 832-N.

Subtractive Signal Architecture

Figure 11:
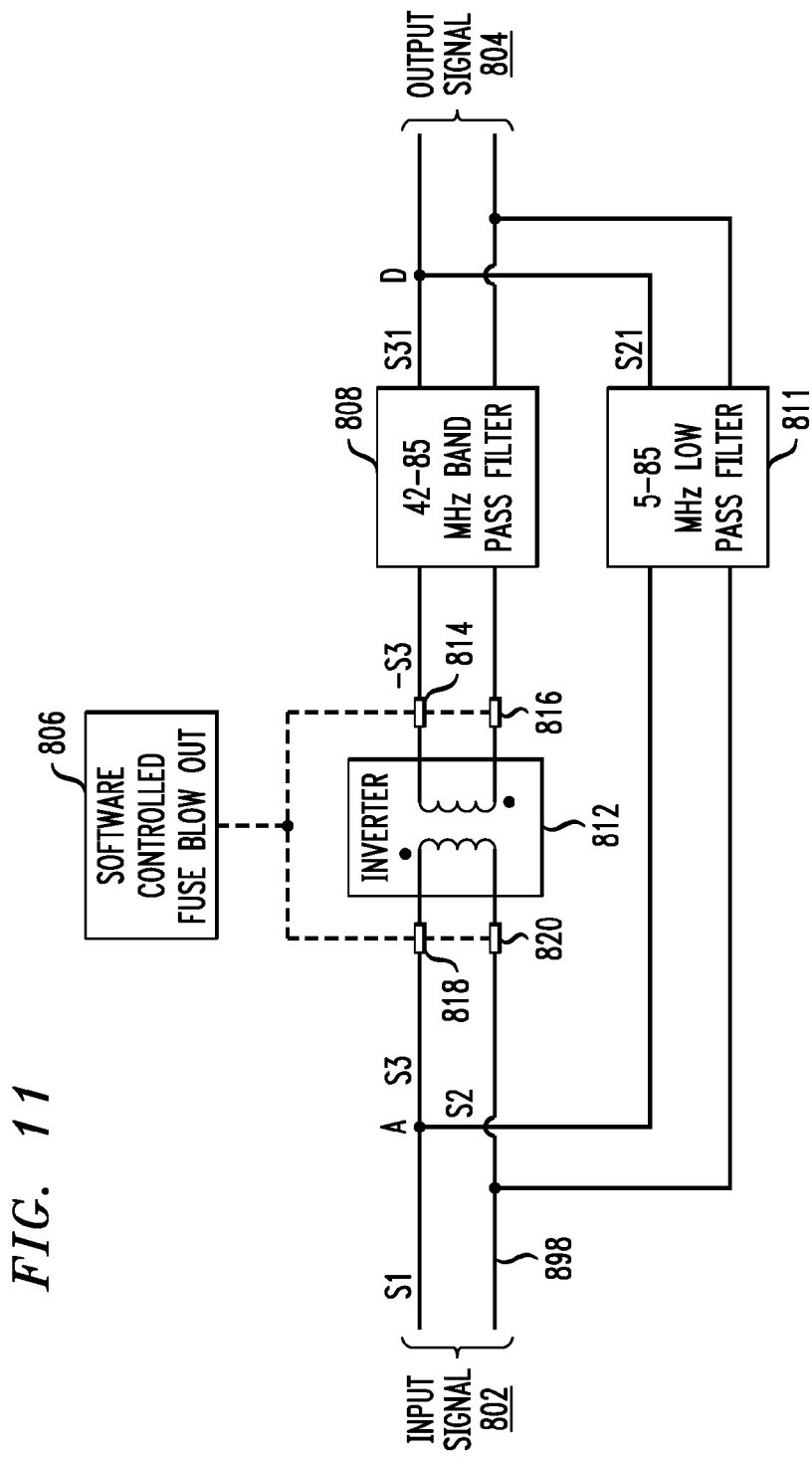
FIG. 11 shows an exemplary specific subtractive signal architecture, in accordance with an aspect of the invention.

FIG. 11 shows an example of a subtractive signal architecture. Elements similar to those in FIGS. 8 and 9 have received the same reference character. The input signal S1, numbered 802, is split into two signals S2 and S3 at point A; where S2 passes to the full band LPF 811 (5-85 MHz in this example), and S3 passes to the bandpass filter bank 808. When the architecture of FIG. 11 is configured to operate in 42 MHz mode, S3 passes to an inverter 812, resulting in −S3, and then through a 42-85 MHz bandpass filter 808, the output of which is designated as S31. S2 passes through the full band LPF 811, the output of which is S21. S21 and S31 combine at point D where S31 cancels out the 42-85 MHz spectral region of S21, and the resulting signal is a 5-42 MHz output signal 804.

As an aside, it should be noted that the specific pass bands in the examples are illustrative and non-limiting; other designs could use different pass bands as appropriate.

To upgrade the CM architecture of FIG. 11 to an 85 MHz CM, the fuses 814, 816, 818, 820 in the 42-85 MHz BPF line are blown via software control 806 discussed above, and thus the output of the signal at point D is a 5-85 MHz signal (i.e., open circuit to filter 808 and output is simply S1 following path through LPF 811).

Figure 12:
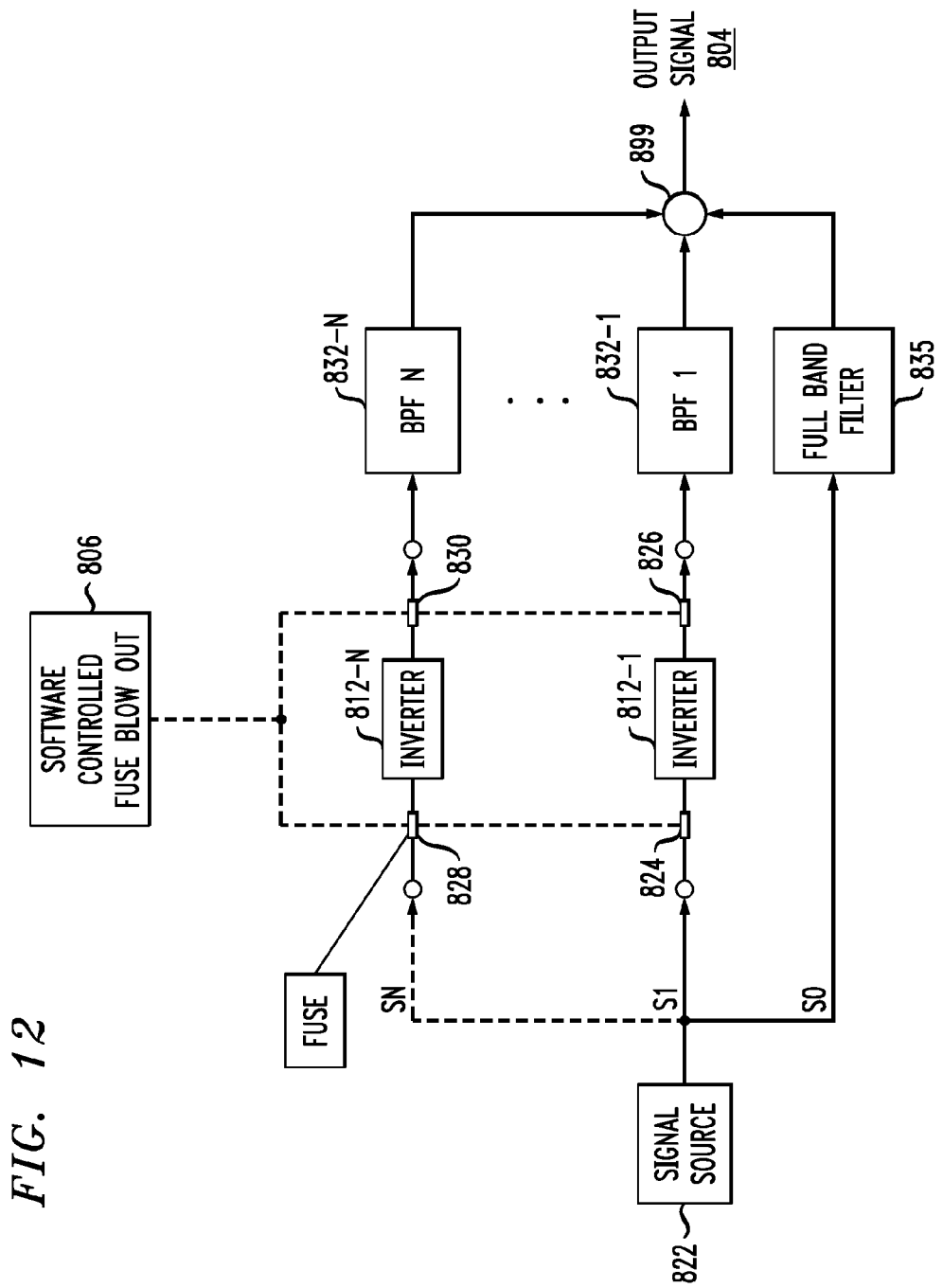
FIG. 12 shows an exemplary generalized subtractive signal architecture, in accordance with an aspect of the invention.

FIG. 12 shows a generalized implementation for the subtractive signal architecture of FIG. 11, where multiple upgrades can be supported. Elements similar to those in FIGS. 8, 9, and 11 have received the same reference character except that S1 in FIG. 11 represents an input signal divided into S2 and S3 while S1 in FIG. 12 represents one of N+1 signals into which an input signal is divided. As in FIG. 9, the ground (reference line) 898 is omitted to avoid clutter. The input signal from signal source 822 is split into N+1 signals S0, S1, . . . , SN. S0 passes to the full-band low-pass filter (LPF) 835, and each of N remaining signals S1, . . . , SN passes, respectively, to inverters 812-1 to 812-N and bandpass filters 1 through N numbered 832-1 through 832-N. With attention also to FIG. 13, in this initial state, the upstream bandwidth is equal to the passband of the full-band LPF 835 less the passband of each of the BPFs BPF 1 through BPF N.

When the architecture of FIG. 12 is configured to operate in first mode, the signal to each of the bandpass filters 832-1 through 832-N is split and inverted in a corresponding inverter 812-1 through 812-N, producing a negative (i.e. inverted or 180 degrees out of phase) signal which, attenuated in filters 832-1 through 832-N, recombines at 899 with the output of the full band filter 835 where the outputs of the BPF 832-1 through 832-N cancel out the corresponding spectral portions passed by full band filter 835, and thus only the lowest (initial) desired upstream bandwidth is achieved for the output signal 804.

In a first upgrade, the fuses 824, 826 associated with inverter 812-1 are blown by control 806 as described above. There is no longer a signal path through BPF 1, and thus, the negative of the pass band of BPF 1 is not subtracted from the output of full-band LPF 835 at 899. Thus, with attention also to FIG. 13, in this first upgraded state, the upstream bandwidth is equal to the passband of the full-band LPF less the passband of each of the BPFs BPF 2 through BPF N.

Fuses associated with intermediate inverters (i.e., between 1 and N, if any) are progressively blown and then in a final upgrade, fuses 828, 830 associated with inverter 812-N are blown. With attention also to FIG. 13, each successive upgrade adds the bandwidth associated with the corresponding BPF to the upstream bandwidth; when the final fuses 828, 830 are blown, the full bandwidth equal to the full-band passband of the LPF 835 is realized.

Figure 14:
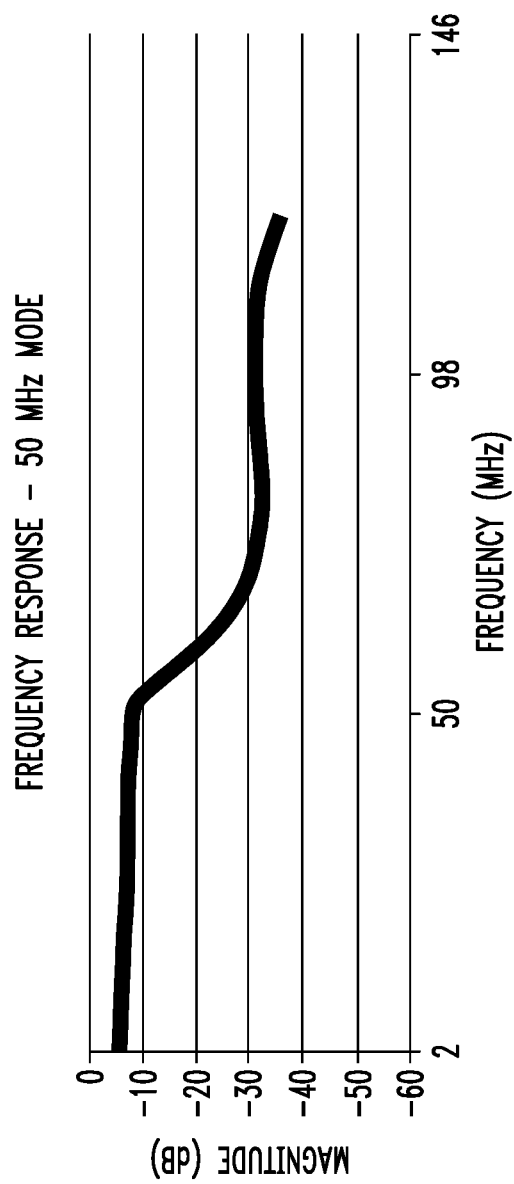
FIG. 14 shows a non-limiting exemplary frequency response in a 50 MHz mode, in accordance with an aspect of the invention.
Figure 15:
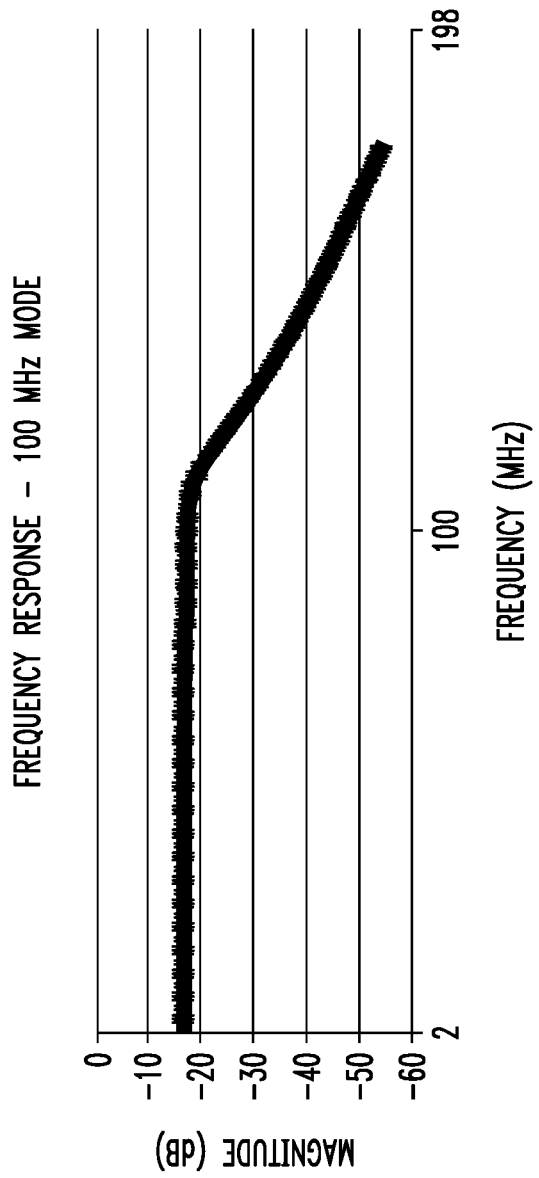
FIG. 15 shows a non-limiting exemplary frequency response in a 50 MHz mode, in accordance with an aspect of the invention.

FIG. 14 shows non-limiting exemplary results for frequency response in a 50 MHz upstream band mode, from experimental tests, for a subtractive architecture. Similar results are expected from the additive architecture. As can be seen, signals are passed with little attenuation up to a frequency of about 50 MHz, after which attenuation increases as desired. FIG. 15 shows non-limiting exemplary results for frequency response in a 100 MHz upstream band mode, from experimental tests, for a subtractive architecture. Similar results are expected from the additive architecture. As can be seen, signals are passed with little attenuation up to a frequency of about 100 MHz, after which attenuation increases as desired.

It should be noted that in general, one or more embodiments can be adapted to a variety of different "before" and "after" frequency ranges. Given the teachings herein, the skilled artisan will be able to select an initial configuration providing the initial minimum desired passband; a final configuration providing the final maximum desired passband; and, optionally, any intermediate configuration(s) providing intermediate desired passband(s) between the initial minimum desired passband and the final maximum desired passband.

It should be noted that, given the teachings herein, a circuit designer having ordinary skill in the art will be able to properly design the fusible links to reduce or eliminate undesirable reflections both before or after the fusible links are blown.

Given the discussion thus far, and with reference to FIGS. 8-10, it will be appreciated that, in general terms, an apparatus, according to an aspect of the invention, includes an input port (location of input signal 802 or signal source 822); an output port (location of output signal 804); a low-pass filter 810 or 834 connected between the input port and the output port; a bandpass filter 808 or 832-1 through 832-N; and an inverter structure connected in series with the bandpass filter. The series-connected inverter structure and bandpass filter are connected in parallel with the low-pass filter between the input port and the output port. The inverter structure in turn includes a transmission line (e.g. 813 or 813-1 through N) and an inverter 812 or 812-1 through N connected in parallel with the transmission line by at least one fusible link 814, 816, 818, 820, or 824, 826, 828, 830 without the use of any switch. In this context, "without the use of any switch" means that the inverter is connected in parallel with the transmission line without the use of any switch; switches could be used for other purposes in other locations within CMs or other CPE configured in accordance with aspects of the invention. Also included is a controller 806 coupled to the at least one fusible link.

The inverter structure, the bandpass filter, and the at least one fusible link are configured, and the controller is configurable, such that signals of a first frequency range, equal to a passband of the low-pass filter, are passed from the input port to the output port under a first condition when the at least one fusible link is intact, and such that signals of a second frequency range, equal to the passband of the low-pass filter plus a passband of the bandpass filter, are passed from the input port to the output port under a second condition when the at least one fusible link is caused to be blown by the controller. This happens in stages in embodiments with multiple BPFs, as shown and discussed with regard to FIG. 9.

It will be appreciated that the aforementioned apparatus may include one or more embodiments of switchless multiband filter architecture as described herein.

Typical cable modems have a built-in controller; the skilled artisan will be familiar with same. In one or more embodiments the controller is configurable by the MSO. For example, the MSO will send firmware from the head end to configure the controller to cause the fuses to blow out. Once this is done, the controller has instructions (e.g., the firmware) stored therein in a non-transitory manner, which instructions configure the controller to cooperate with the inverter structure, the bandpass filter, and the at least one fusible link, such that signals of the first frequency range, equal to the passband of the low-pass filter, are passed from the input port to the output port under the first condition when the at least one fusible link is intact, and such that signals of the second frequency range, equal to the passband of the low-pass filter plus the passband of the bandpass filter, are passed from the input port to the output port under the second condition when the at least one fusible link is caused to be blown by the controller.

Referring to FIG. 9, in some cases, the bandpass filter is a first bandpass filter 832-1; the inverter structure is a first inverter structure including elements 812-1 and 813-1; the transmission line is a first transmission line 813-1; the inverter is a first inverter 812-1; and the at least one fusible link includes a first at least one fusible link 824, 826. As used herein, a "first" at least one fusible link means one or more fusible links associated with a first inverter, a "second" at least one fusible link means one or more fusible links associated with a second inverter, and so on.

As seen in FIG. 9, also included are a second bandpass filter (832-N with N=2) and a second inverter structure (812-N and 813-N with N=2) connected in series with the second bandpass filter. The series-connected second inverter structure and second bandpass filter are connected in parallel with the low-pass filter 834 and the series-connected first inverter structure (812-1 and 813-1) and first bandpass filter 832-1 between the input port and the output port.

The second inverter structure in turn includes a second transmission line 813-N with N=2 and a second inverter 812-N with N=2 connected in parallel with the second transmission line by a second at least one fusible link 887-N, 889-N with N=2 without the use of any switch. The controller 806 is also coupled to the second at least one fusible link. The first and second inverter structures, the bandpass filter, and the first and second at least one fusible links are further configured, and the controller is further configurable, such that signals of the first frequency range, equal to a passband of the low-pass filter, are passed from the input port to the output port under a first condition when the first and second least one fusible links are intact; such that signals of the second frequency range, equal to the passband of the low-pass filter plus the passband of the first bandpass filter, are passed from the input port to the output port under the second condition when the first at least one fusible link is caused to be blown by the controller; and such that signals of a third frequency range, equal to the passband of the low-pass filter plus the passbands of the first and second bandpass filters, are passed from the input port to the output port under a third condition when the first at least one fusible link and the second at least one fusible link are caused to be blown by the controller.

As noted, in one or more embodiments the controller is configurable by the MSO. For example, the MSO will send firmware from the head end to configure the controller to cause the fuses to blow out. Once this is done, the controller has instructions (e.g., the firmware) stored therein in a non-transitory manner, which instructions configure the controller to act as just described.

In one or more embodiments, the first and second frequency ranges are radio frequencies; for example, the first frequency range could be five to forty-two MHz and the second frequency range could be five to eighty-five MHz. Other ranges could be used in other embodiments.

In one or more embodiments, the apparatus includes a data over cable system interface standard (DOCSIS) compliant cable modem and the signals of the first and second frequency ranges include upstream signals from the data over cable system interface standard (DOCSIS) compliant cable modem into the cable television network (e.g., destined for a head end thereof).

Figure 13:
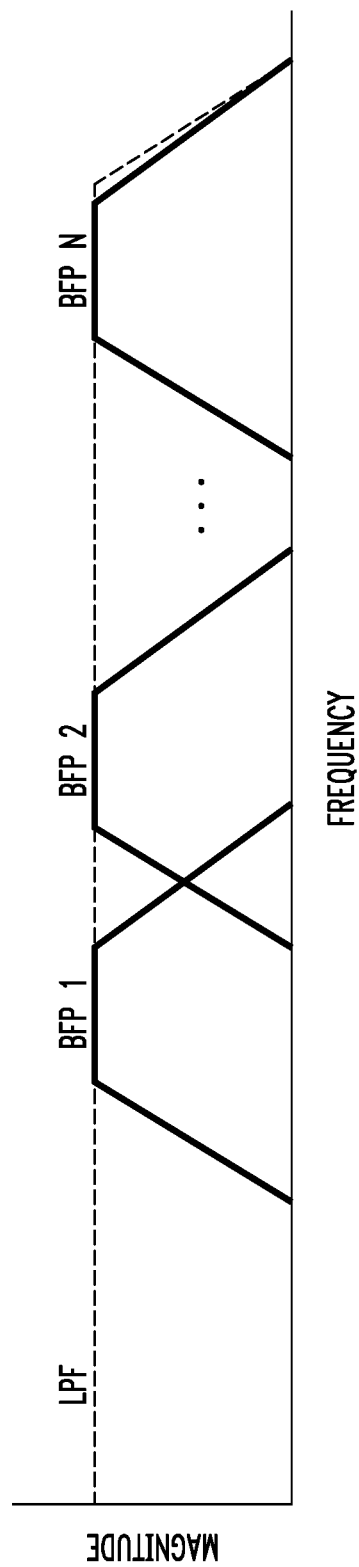
FIG. 13 shows pass-bands of a low-pass filter and a plurality of band-pass filters, of the exemplary subtractive additive signal architecture of FIG. 12, in accordance with an aspect of the invention.

Furthermore, given the discussion thus far, and with reference to FIGS. 11-13, it will be appreciated that, in general terms, another exemplary apparatus, according to another aspect of the invention, includes an input port (location of input signal 802 or signal source 822); an output port (location of output signal 804); a full-band low-pass filter 811 or 835 connected between the input port and the output port; N bandpass filters 808 or 832-1 through 832-N (N being an integer at least equal to one); and N inverters 812 or 812-1 through 812-N connected in series with the N bandpass filters by N at least one fusible links 814, 816, 818, 820, or 824, 826, 828, 830 without the use of any switch. In this context, "without the use of any switch" means that the inverter(s) are connected in series with the bandpass filter(s) without the use of any switch; switches could be used for other purposes in other locations within CMs or other CPE configured in accordance with aspects of the invention. The N series-connected inverters and bandpass filters are connected in parallel with the full-band low-pass filter 811 or 835 between the input port and the output port. Also included is a controller 806 coupled to the N at least one fusible links.

The N inverters, the N bandpass filters, and the N at least one fusible links are configured, and the controller is configurable, such that signals of a first frequency range, equal to a passband of the full-band low-pass filter less a combined passband of the N bandpass filters (when N=1, combined passband is just the passband of the single bandpass filter), are passed from the input port to the output port under a first condition when the N at least one fusible links are intact, and such that signals of a second frequency range, equal to the passband of the full-band low-pass filter, are passed from the input port to the output port under a second condition when the N at least one fusible links are caused to be blown by the controller. This happens in stages in embodiments with multiple BPFs, as shown and discussed with regard to FIG. 12.

It will be appreciated that the aforementioned apparatus may include one or more embodiments of switchless multiband filter architecture as described herein.

As noted above, typical cable modems have a built-in controller. The skilled artisan will be familiar with such controllers. In one or more embodiments the controller is configurable by the MSO. For example, the MSO will send firmware from the head end to configure the controller to cause the fuses to blow out. Once this is done, the controller has instructions (e.g., the firmware) stored therein in a non-transitory manner, which instructions affirmatively configure the controller to act as described.

As noted, N is an integer greater than or equal to one. Consider that when N=2, the N inverters, the N bandpass filters, and the N at least one fusible links are further configured, and the controller is further configurable, such that signals of a third frequency range, equal to a passband of the full-band low-pass filter less a passband of one of the N bandpass filters, are passed from the input port to the output port under a third condition when one of the N at least one fusible links are intact, and another of the N at least one fusible links are caused to be blown by the controller. This was discussed with regard to the progressive blowing of fuses in FIG. 12. Again, as noted, in one or more embodiments the controller is configurable by the MSO. For example, the MSO will send firmware from the head end to configure the controller to cause the fuses to blow out. Once this is done, the controller has instructions (e.g., the firmware) stored therein in a non-transitory manner, which instructions configure the controller to act as just described.

In one or more embodiments, the first and second frequency ranges are radio frequencies; for example, the first frequency range could be five to forty-two MHz and the second frequency range could be five to eighty-five MHz. Other ranges could be used in other embodiments.

In one or more embodiments, the apparatus includes a data over cable system interface standard (DOCSIS) compliant cable modem and the signals of the first and second frequency ranges include upstream signals from the data over cable system interface standard (DOCSIS) compliant cable modem into the cable television network (e.g., destined for a head end thereof).

Yet further, given the discussion thus far, it will be appreciated that, in general terms, an exemplary method, according to still another aspect of the invention, includes the steps of providing a cable modem (e.g., in CPE 106) in a premises (e.g., home 240); operating the cable modem in a first mode with a first upstream passband (e.g., any of the architectures before the fuse(s) is/are blown); and causing (e.g., via a firmware upgrade) at least one fusible link in the cable modem to blow, to in turn cause the cable modem to upgrade to a second mode with a second upstream passband, greater than the first upstream passband, without use of any switch. In this context, "without the use of any switch" means that the physical configuration of the cable modem changes to cause the cable modem to upgrade to the second mode with the second upstream passband, greater than the first upstream passband, without the use of any switch. However, switches could be used for other purposes in other locations within CMs or other CPE configured in accordance with aspects of the invention, and/or a switch other than a switchable diplex filter could be used to cause the fusible links to blow. Furthermore, stating that the second upstream passband is greater than the first upstream passband means that it is wider than the first upstream passband and not that there is not overlap between the two passbands. Indeed, in one or more embodiments, the passbands overlap in that the second upstream passband includes the first upstream passband plus additional bandwidth.

Referring again to FIGS. 8-10, in some cases, the step of operating the cable modem in the first mode includes passing a first portion S2 of an upstream input signal through a low-pass filter 810 or 834; splitting a second portion S3 of the upstream input signal into a first sub-portion S32 passed through a transmission line 813 or 813-1 to 813-N and a second sub-portion S31 passed through an inverter 812 or 812-1 to 812-N connected in parallel with the transmission line by the at least one fusible link. The transmission line and the inverter together form an inverter structure that is in series with a bandpass filter 808 or 832-1 through 832-N. The step of operating the cable modem in the first mode further includes rejoining the first and inverted second sub-portions of the second portion (e.g., at C or 887-1 through N) to cancel the second portion. A further step includes operating the cable modem in the second mode (fuse(s) blown) by passing the first portion of the upstream input signal S2 through the low-pass filter; passing the second portion of the upstream input signal S3 through the transmission line (which, with the appropriate fuse(s) blown, is now in series with the bandpass filter) and adding outputs of the low-pass filter and the bandpass filter.

In some cases, the bandpass filter includes a first bandpass filter 832-1; the inverter includes a first inverter 812-1; the transmission line includes a first transmission line 813-1; the inverter structure includes a first inverter structure; and the at least one fusible link includes a first at least one fusible link 887-1 and 889-1. In such cases, the step of operating the cable modem in the first mode includes:

passing the first portion S0 of the upstream input signal through the low-pass filter 834;

splitting the second portion S1 of the upstream input signal into the first sub-portion passed through the first transmission line 813-1 and the second sub-portion passed through the first inverter 812-1 connected in parallel with the first transmission line by the first at least one fusible link;

rejoining the first and inverted second sub-portions of the second portion to cancel the second portion;

splitting a third portion (e.g., SN with N=2) of the upstream input signal into a third sub-portion passed through a second transmission line (e.g., 813-N with N=2) and a fourth sub-portion passed through a second inverter (e.g., 812-N with N=2) connected in parallel with the second transmission line by a second at least one fusible link (the second transmission line and the second inverter together form a second inverter structure which is in series with a second bandpass filter (832-N with N=2); and rejoining the third and inverted fourth sub-portions of the third portion to cancel the third portion. Note that in this example, the sub-portions are numbered as first, second, third, and fourth overall and the third portion has two sub-portions referred to as the third and fourth sub-portions while the second portion has two sub-portions referred to as the first and second sub-portions.

Furthermore, the step of operating the cable modem in the second mode includes:

passing the first portion S0 of the upstream input signal through the low-pass filter;

passing the second portion S1 of the upstream input signal through the first transmission line 813-1, the first at least one fusible link 887-1, 889-1 now being blown so that the first transmission line 813-1 and the first bandpass filter 832-1 are in series;

passing the third portion of the upstream input signal SN with N=2 through the second transmission line 813-N with N=2, the second at least one fusible link now being blown so that the second transmission line 813-N with N=2 and the second bandpass filter 832-N with N=−2 are in series; and adding outputs of the low-pass filter and the first and second bandpass filters;

Further, an additional step includes operating the cable modem in a third mode (in one or more embodiments, temporally intermediate the first and second modes) by:

passing the first portion S0 of the upstream input signal through the low-pass filter 834;

passing the second portion of the upstream input signal S1 through the first transmission line, the first at least one fusible link 887-1, 889-1 now being blown so that the first transmission line 813-1 and the first bandpass filter 832-1 are in series;

splitting the third portion SN with N=2 of the upstream input signal into the third sub-portion passed through the second transmission line 813-N with N=2 and the fourth sub-portion passed through the second inverter 812-N with N=2 connected in parallel with the second transmission line by the second at least one fusible link 887-$n$, 889-N with N=2 (the second transmission line and the second inverter together form the second inverter structure, which is in series with the second bandpass filter 832-N with N=2);

rejoining the third and inverted fourth sub-portions of the third portion to cancel the third portion; and adding outputs of the low-pass filter and the first bandpass filter.

Referring again to FIGS. 11-13, in some cases, the at least one fusible link is one of N at least one fusible links, N being an integer at least equal to one; and the step of operating the cable modem in the first mode includes passing a first portion S2 of an upstream input signal through a full-band low-pass filter 811 or 835; passing a second portion S3 of the upstream input signal through N inverters 812 or 812-1 through 812-N connected in series with N bandpass filters 808 or 832-1 through 832-N by the N at least one fusible links; and adding outputs of the full-band low-pass filter and the N bandpass filters to obtain an output having a bandwidth equal to a passband of the full-band low-pass filter less a combined passband of the N bandpass filters. A further step includes operating the cable modem in the second mode (fuses blown) by passing the upstream input signal, S1=S2 in FIG. 11, through the full-band low-pass filter.

Referring to FIG. 12, when N is 2 or more, a further step includes operating the cable modem in a third mode (refer to discussion of progressive fuse blow with regard to FIG. 12; consider fuses 824, 826 as blown and others intact) by:

passing a third portion (S0 label in FIG. 12 but referred to as a third portion under conditions of third mode) of an upstream input signal through a full-band low-pass filter 835; and passing a fourth portion (e.g., S2 to SN in FIG. 12 but referred to as a fourth portion under conditions of third mode) of the upstream input signal through N−1 inverters (812-2 through 812-N) connected in series with N−1 bandpass filters (832-2 through 832-N) by N−1 of the N at least one fusible links; and adding outputs of the full-band low-pass filter and the N−1 bandpass filters to obtain an output having a bandwidth equal to a passband of the full-band low-pass filter less a combined passband of the N−1 bandpass filters.

In some cases, in the step of operating the cable modem in the first mode with the first upstream passband, the first upstream passband is a first radio frequency passband (in a non-limiting example, five to forty-two MHz); and in the step of causing the at least one fusible link in the cable modem to blow, to in turn cause the cable modem to upgrade to the second mode with the second upstream passband, the second upstream passband is a second radio frequency passband (in a non-limiting example, five to eighty-five MHz).

In some cases, in the step of providing the cable modem, the cable modem is a data over cable system interface standard (DOCSIS) compliant cable modem; and the step of operating the cable modem in the first mode with the first upstream passband includes passing signals through the first upstream passband from the cable modem into a cable television network (e.g., HFC network 101). Furthermore, an additional step in such instances includes operating the cable modem in the second mode by passing signals through the second upstream passband from the cable modem into the cable television network.

Figure 16:
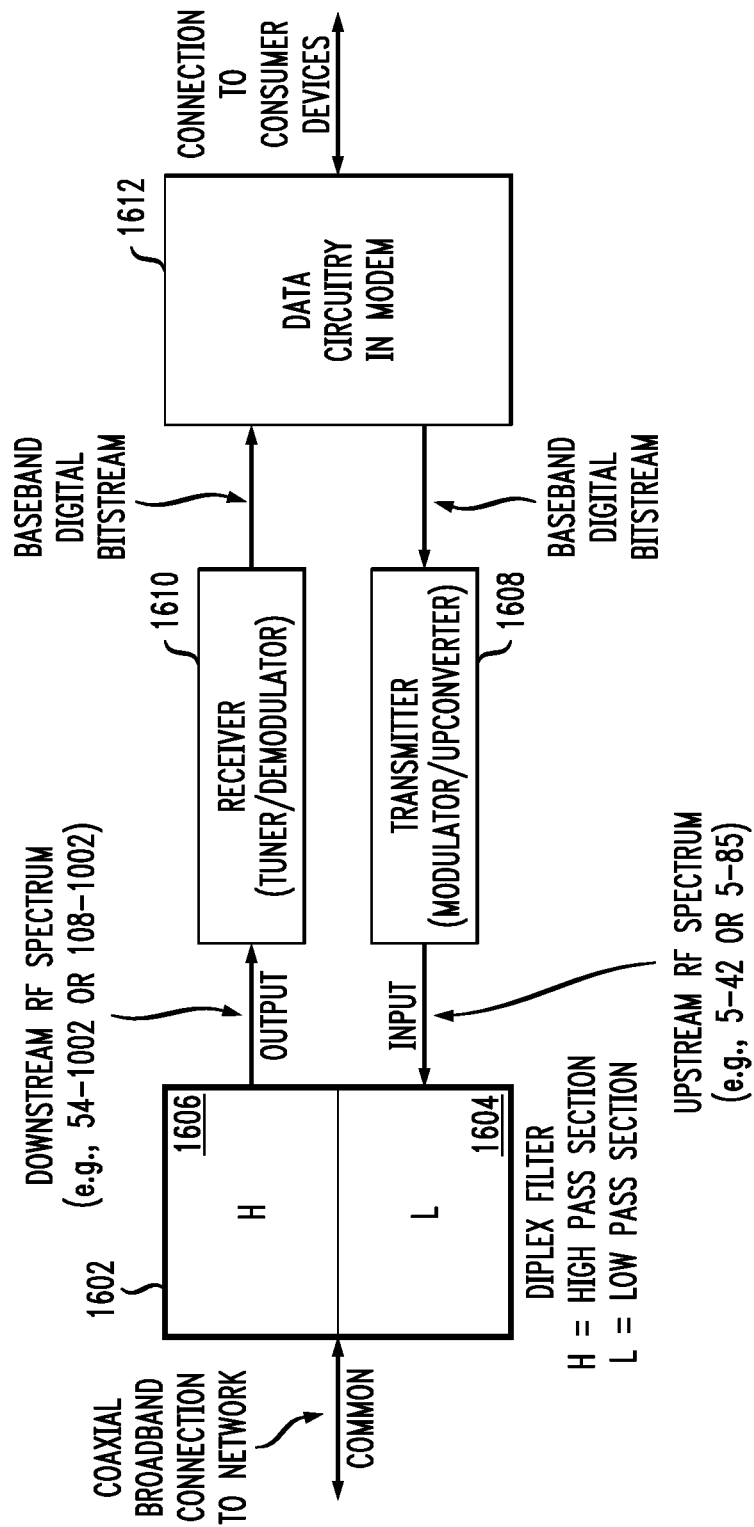
FIG. 16 is a block diagram showing exemplary integration with a cable modem, in accordance with an aspect of the invention.

FIG. 16 is a block diagram showing exemplary integration with a cable modem, in accordance with an aspect of the invention. Filter circuitry 1602 (here, diplex filter including low pass section 1604 and high pass section 1606) is typically too large to be reduced onto a silicon chip die, and is therefore typically located on the circuit board near where the RF input port attaches to the modem's external cable coax connector ("coaxial broadband connection to network"). FIG. 16 shows a non-limiting example of how the filter 1602 interfaces with the rest of the modem and how the cable network connects. Note the common, output, and input ports. A passive filter has no directionality; it merely separates the passbands. For instance, a high-channel signal that appeared at the "output" in FIG. 16 will actually traverse the filter and show up at the "common."

In FIG. 16, the diplex filter 1602 has an input port, an output port, and a common. It should be noted that in one or more embodiments, the low pass section 1604 includes one of the reconfigurable (adjustable) filter architectures shown in FIGS. 8, 9, 11, and 12 while the high pass section 1606 is permanently configured. Thus, one or more switchless multi-band filter architectures in accordance with aspects of the invention can be used as the low-pass sections of a diplex filter 1602 in a cable modem. It is worth noting that the "input" and "output" in FIG. 16 are of the overall three-terminal diplex filter (input, output, and common) and are not in general the same as the "input port" and "output port" referred to in the description of the reconfigurable filter architectures shown in FIGS. 8, 9, 11, and 12, which are named with specificity focusing on upstream signals. Given the teachings herein, the skilled artisan can integrate one or more of the reconfigurable (adjustable) filter architectures shown in FIGS. 8, 9, 11, and 12 into a diplex filter 1602.

Furthermore in this regard, the output of the diplex filter 1602 includes the downstream RF spectrum (e.g., 54-1002 MHz or 108-1002 MHz) and is passed to the receiver 1610 (typically including a tuner and demodulator). Traditional tuner functionality is often on-chip. The tuner outputs a baseband digital bitstream to the data circuitry 1612 in the modem; which in turn connects to one or more consumer devices. Looking at the upstream path, a baseband digital bitstream is passed from the data circuitry 1612 in the modem to the transmitter 1608 (typically a modulator and upconverter), the output of which is in the upstream RF spectrum (e.g., 5-42 MHz or 5-85 MHz) and which then passes into the diplex filter.

Switches, where utilized, are typically also implemented as outboard devices (FET-based (FET=field effect transistor) switches are commonly used in RF products). "Hybrid" products (where components are not on-die, but are in-package) may be used in some embodiments. By way of analogy, consider the RF gain blocks used in CATV outdoor repeater amplifiers, where transformers and couplers are in-package but not on-die.

Figure 17:
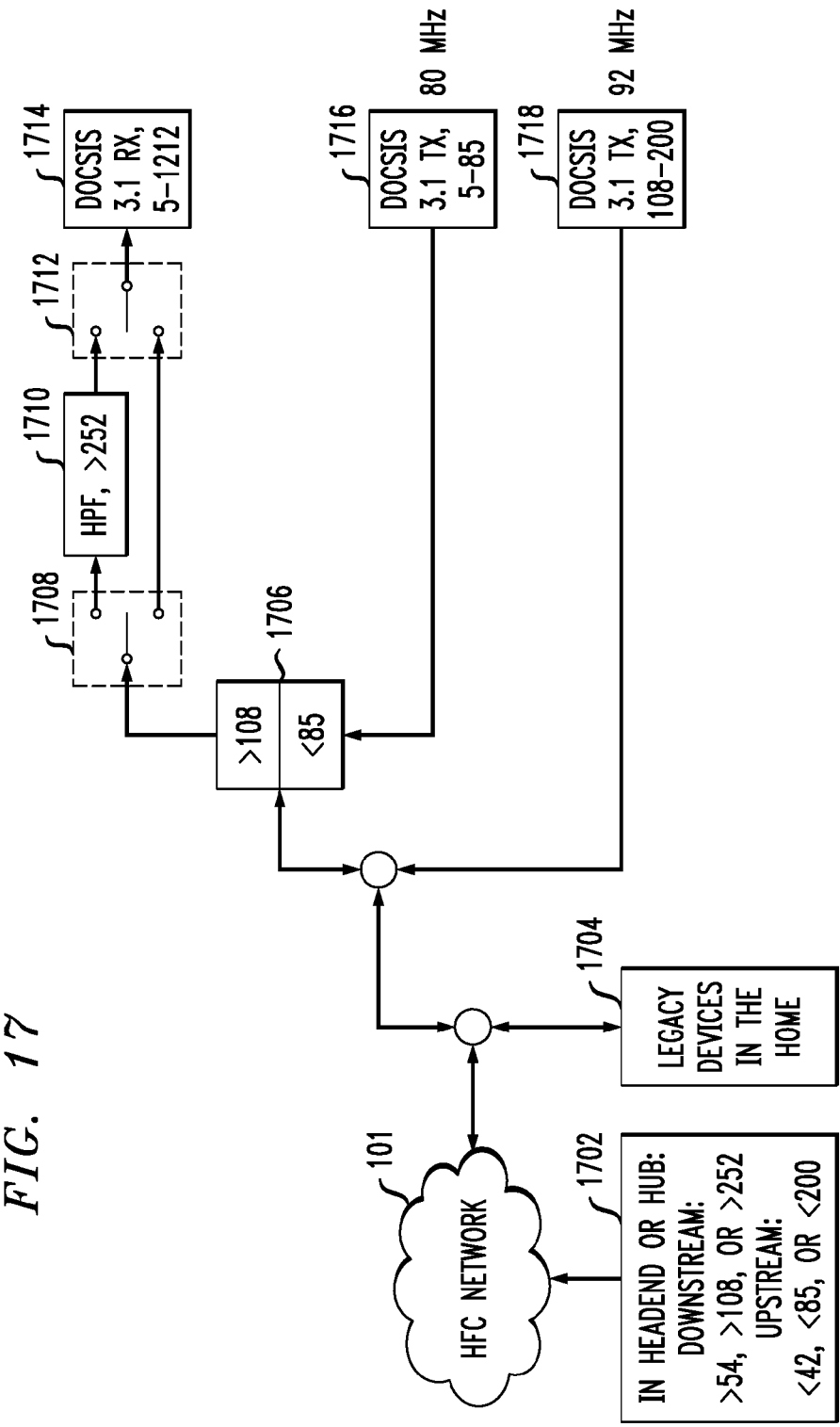
FIGS. 17-21 are non-limiting examples various possible "switched" filter topologies which can be implemented with fusible links instead of switches, in accordance with aspects of the invention.

FIGS. 17-21 are non-limiting examples various possible "switched" filter topologies which can be implemented with fusible links instead of switches, in accordance with aspects of the invention. FIGS. 17-21 illustrate how filters can be cascaded to have the desired effect. In FIG. 17 (dual-transmitter modem with 252 MHz high pass filter), as seen at 1702, downstream signals may be greater than 54 MHz, greater than 108 MHz, or greater than 252 MHz while corresponding upstream signals my be, respectively, less than 42 MHz, less than 85 MHz, or less than 200 MHz. Legacy devices may be connected as shown at 1704. Also included are a DOCSIS receiver 1714 (5-1212 MHz); a DOCSIS transmitter 1716 (5-85 MHz), and a DOCSIS transmitter 1718 (108-200 MHz). Diplex filter 1706 has a low pass section for signals less than 85 MHz and a high-pass section for signals greater than 108 MHz. Switch structures 1708, 1712 connect 1706 to 1714 directly or through a high pass filter 1710 (signals greater than 252 MHz). Fusible links can be used to implement switch structures 1708, 1712 instead of actual switches.

Figure 18:
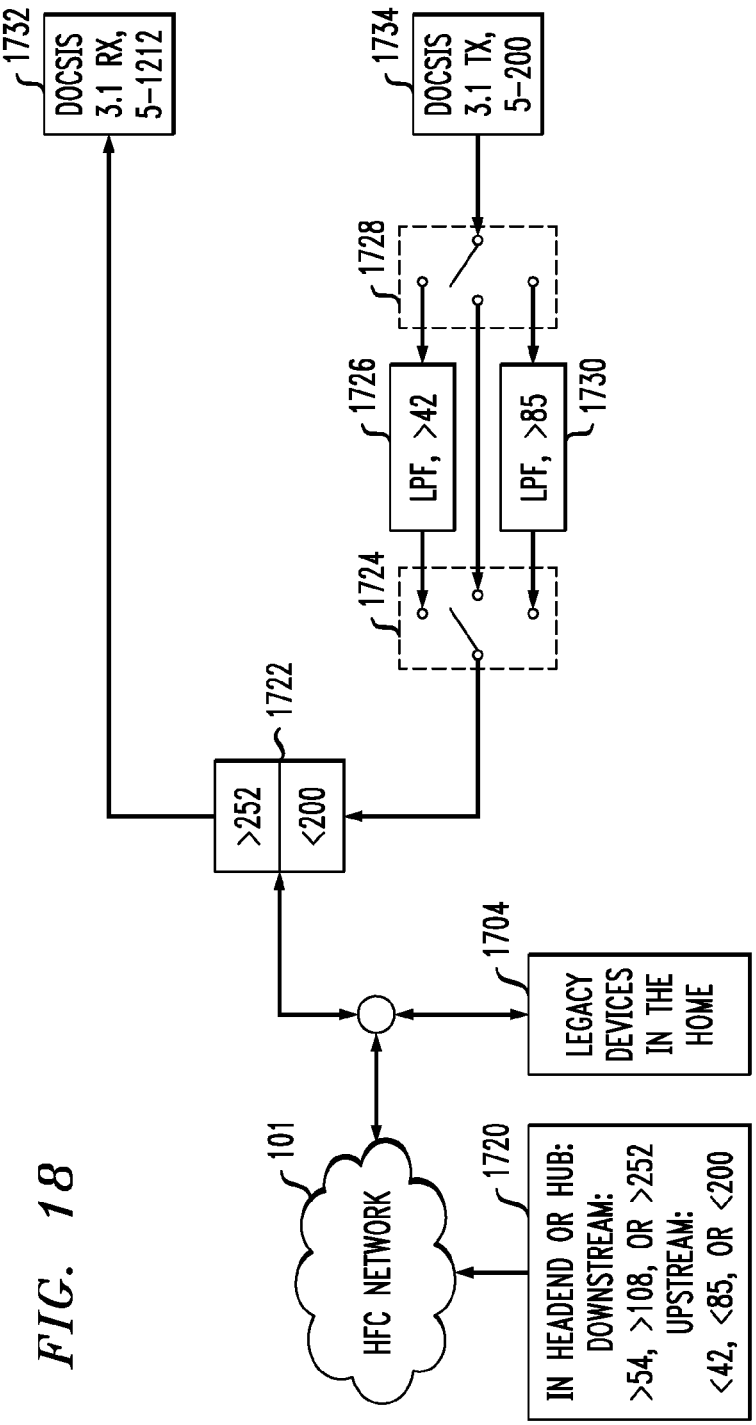

In FIG. 18 (exemplary DOCSIS 3.1 modem diplexer), as seen at 1720, downstream signals may be greater than 54 MHz, greater than 108 MHz, or greater than 252 MHz while corresponding upstream signals my be, respectively, less than 42 MHz, less than 85 MHz, or less than 200 MHz. Legacy devices may be connected as shown at 1704. Also included are a DOCSIS receiver 1732 (5-1212 MHz) and a DOCSIS transmitter 1734 (5-200 MHz). Diplex filter 1722 has a low pass section for signals less than 200 MHz and a high-pass section for signals greater than 252 MHz. Switch structures 1724, 1728 connect 1722 to 1734 directly or through a low pass filter 1726 (signals less than 42 MHz) or low pass filter 1730 (signals less than 85 MHz). Fusible links can be used to implement switch structures 1708, 1712 instead of actual switches.

Figure 19:
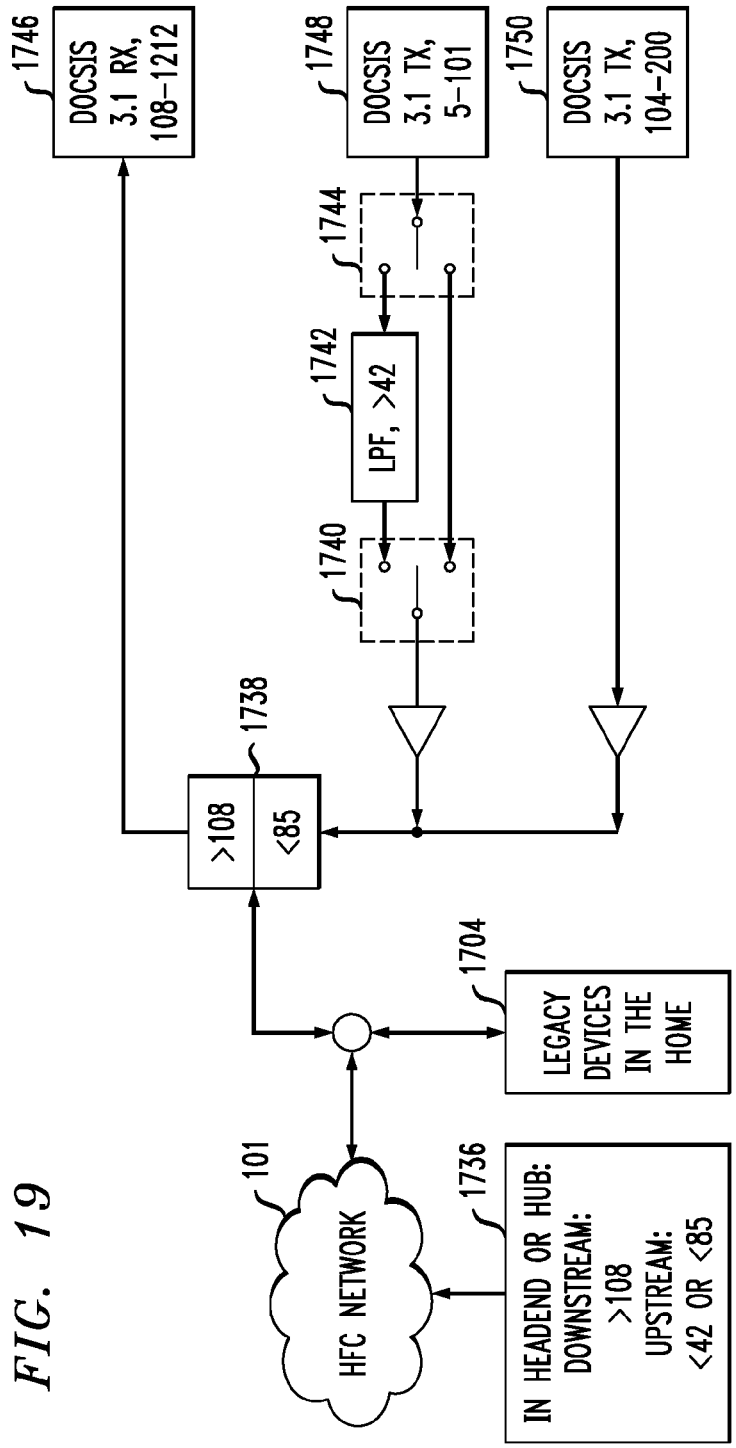

In FIG. 19 (exemplary DOCSIS 3.1 modem diplexer switchable design option 42/108 and 85/108), as seen at 1736, downstream signals may be greater than 108 MHz while corresponding upstream signals may be, respectively, less than 42 MHz or less than 85 MHz. Legacy devices may be connected as shown at 1704. Also included are a DOCSIS receiver 1746 (108-1212 MHz); a DOCSIS transmitter 1748 (5-101 MHz), and a DOCSIS transmitter 1750 (104-200 MHz). Diplex filter 1738 has a low pass section for signals less than 85 MHz and a high-pass section for signals greater than 108 MHz. Switch structures 1740, 1744 connect 1748 to 1738 directly or through a low pass filter 1742 (signals less than 42 MHz). Fusible links can be used to implement switch structures 1740, 1744 instead of actual switches.

Figure 20:
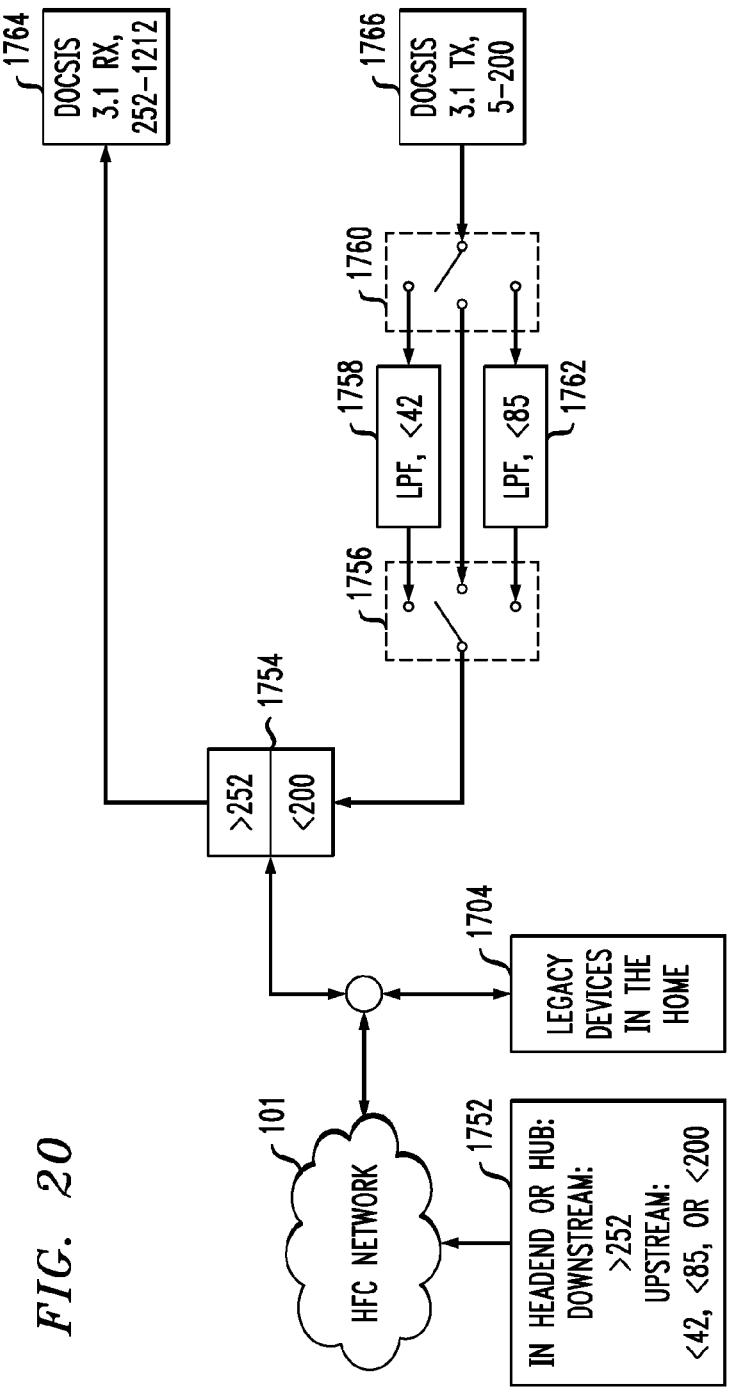

In FIG. 20 (exemplary DOCSIS 3.1 modem diplexer switchable design option 42/252, 85/252, and 200/252), as seen at 1752, downstream signals may be greater than 252 MHz while corresponding upstream signals may be, respectively, less than 42 MHz, less than 85 MHz, or less than 200 MHz. Legacy devices may be connected as shown at 1704. Also included are a DOCSIS receiver 1764 (252-1212 MHz) and a DOCSIS transmitter 1766 (5-200 MHz). Diplex filter 1754 has a low pass section for signals less than 200 MHz and a high-pass section for signals greater than 252 MHz. Switch structures 1756, 1760 connect 1766 to 1754 directly or through a low pass filter 1758 (signals less than 42 MHz) or low pass filter 1762 (signals less than 85 MHz). Fusible links can be used to implement switch structures 1756, 1760 instead of actual switches.

Figure 21:
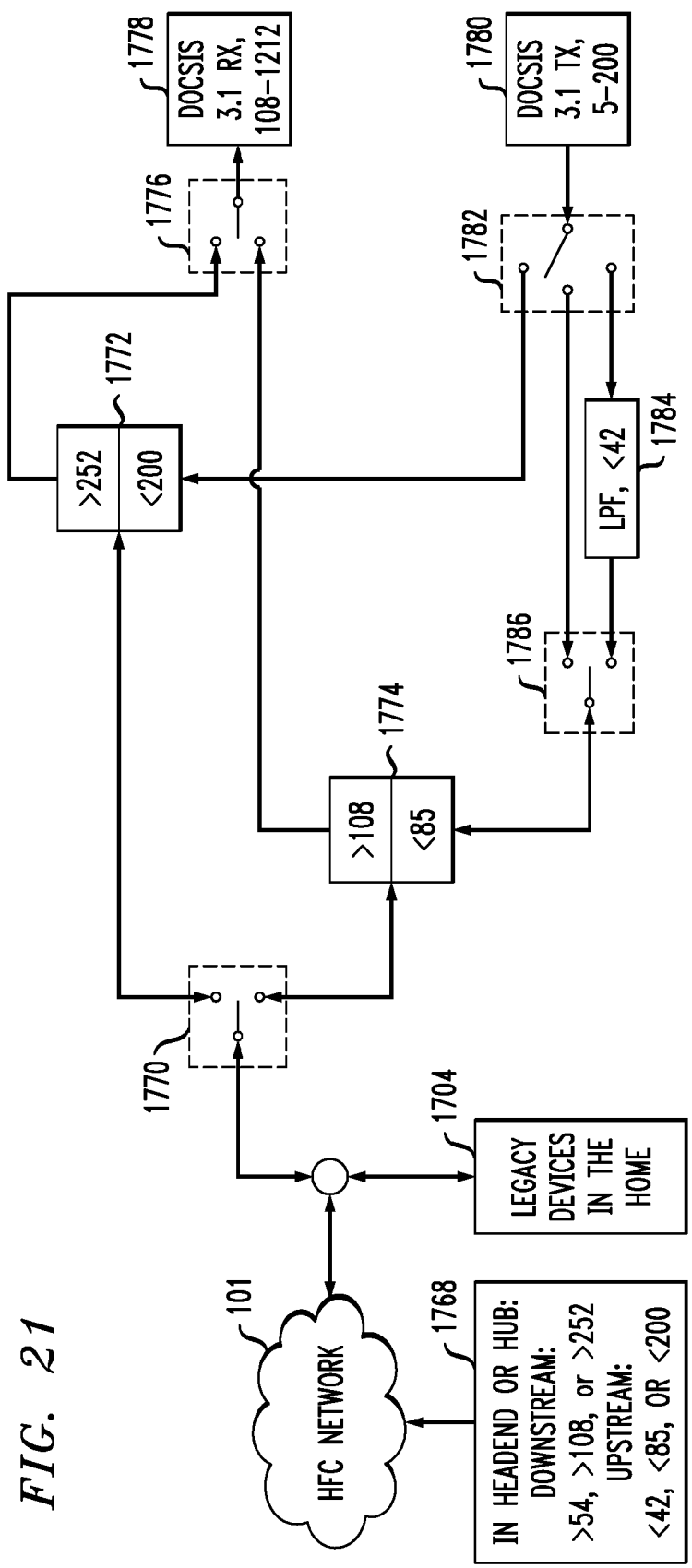

In FIG. 21 (exemplary DOCSIS 3.1 modem diplexer switchable design option 42/108, 85/108, 42/252, 85/252, and 200/252), as seen at 1768, downstream signals may be greater than 54 MHz, greater than 108 MHz, or greater than 252 MHz while corresponding upstream signals my be, respectively, less than 42 MHz, less than 85 MHz, or less than 200 MHz. Legacy devices may be connected as shown at 1704. Also included are a DOCSIS receiver 1778 (108-1212 MHz) and a DOCSIS transmitter 1780 (5-200 MHz). Diplex filter 1772 has a low pass section for signals less than 200 MHz and a high-pass section for signals greater than 252 MHz. Diplex filter 1774 has a low pass section for signals less than 85 MHz and a high-pass section for signals greater than 108 MHz. Switch structure 1770 selectively connects the network interface to filter 1774 or filter 1772. Switch structure 1776 selectively connects the receiver 1778 to filter 1774 or filter 1772. Switch structure 1782 selectively connects the transmitter 1780 to filter 1772, directly to filter 1774, or to filter 1774 through low pass filter 1784 (signals less than 42 MHz). Switch structure 1786 selectively connects the filter 1774 directly to transmitter 1780, or to transmitter 1780 through low pass filter 1784 (signals less than 42 MHz). Fusible links can be used to implement switch structures 1770, 1776, 1782, 1786 instead of actual switches.

FIGS. 16-21 are exemplary and non-limiting. For example, circuits need not be configured using discretely connected blocks; one or more functions can be combined into an integrated circuit topology as will be appreciated by the skilled artisan, given the teachings herein. Additive and subtractive circuits could be implemented within the diplexer, and not just externally as shown in the non-limiting examples.

System and Article of Manufacture Details

The invention can employ hardware aspects or a combination of hardware and software aspects. Software includes but is not limited to firmware, resident software, microcode, etc. At least a portion of one or more embodiments of the invention or elements thereof can be implemented in the form of an article of manufacture including a machine readable medium that contains one or more programs which when executed implement such step(s); that is to say, a computer program product including a tangible computer readable recordable storage medium (or multiple such media) with computer usable program code configured to implement the method steps indicated, when run on one or more processors. Furthermore, at least a portion of one or more embodiments of the invention or elements thereof can be implemented in the form of an apparatus including a memory and at least one processor that is coupled to the memory and operative to perform, or facilitate performance of, exemplary method steps.

Yet further, in another aspect, at least a portion of one or more embodiments of the invention or elements thereof can be implemented in the form of means for carrying out one or more of the method steps described herein; the means can include (i) specialized hardware module(s), (ii) software module(s) executing on one or more general purpose or specialized hardware processors, or (iii) a combination of (i) and (ii); any of (i)-(iii) implement the specific techniques set forth herein, and the software modules are stored in a tangible computer-readable recordable storage medium (or multiple such media). The means do not include transmission media per se or disembodied signals per se. Appropriate interconnections via bus, network, and the like can also be included.

Figure 7:
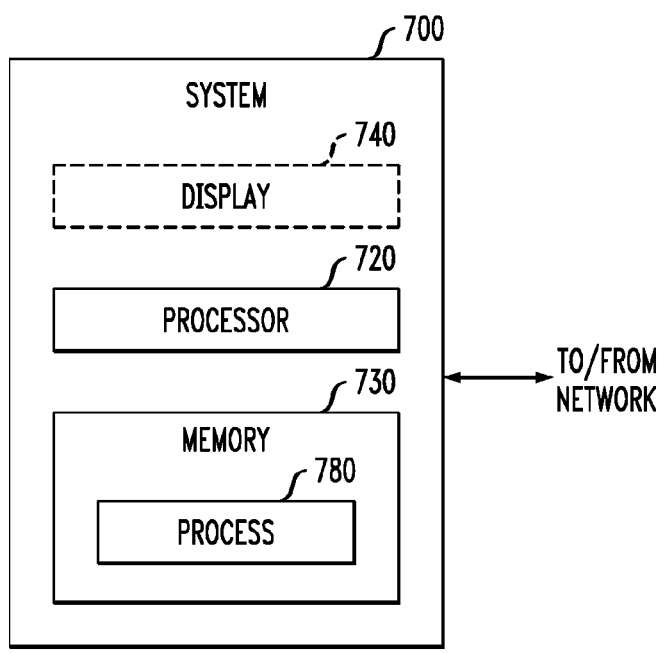
FIG. 7 is a block diagram of a computer system useful in connection with one or more aspects of the invention.

FIG. 7 is a block diagram of a system 700 that can implement at least some aspects of the invention, and is representative, for example, of one or more of the servers shown in the figures. As shown in FIG. 7, memory 730 configures the processor 720 to implement one or more methods, steps, and functions (collectively, shown as process 780 in FIG. 7). The memory 730 could be distributed or local and the processor 720 could be distributed or singular. Different steps could be carried out by different processors.

The memory 730 could be implemented as an electrical, magnetic or optical memory, or any combination of these or other types of storage devices. It should be noted that if distributed processors are employed, each distributed processor that makes up processor 720 generally contains its own addressable memory space. It should also be noted that some or all of computer system 700 can be incorporated into an application-specific or general-use integrated circuit. For example, one or more method steps could be implemented in hardware in an ASIC rather than using firmware—an ASIC chip could be used to initiate the fusible link blowout. Display 740 is representative of a variety of possible input/output devices (e.g., keyboards, mice, and the like). Every processor may not have a display, keyboard, mouse or the like associated with it.

As is known in the art, at least a portion of one or more aspects of the methods and apparatus discussed herein may be distributed as an article of manufacture that itself includes a tangible computer readable recordable storage medium having computer readable code means embodied thereon. The computer readable program code means is operable, in conjunction with a computer system (including, for example, system 700 or the like), to carry out all or some of the steps to perform the methods or create the apparatuses discussed herein. A computer readable medium may, in general, be a recordable medium (e.g., floppy disks, hard drives, compact disks, EEPROMs, or memory cards) or may be a transmission medium (e.g., a network including fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic medium or height variations on the surface of a compact disk. The medium can be distributed on multiple physical devices (or over multiple networks). As used herein, a tangible computer-readable recordable storage medium is defined to encompass a recordable medium, examples of which are set forth above, but is defined not to encompass a transmission medium or disembodied signal.

The computer systems and servers and other pertinent elements described herein each typically contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

Accordingly, it will be appreciated that at least a portion of one or more embodiments of the invention can include a computer program comprising computer program code means adapted to perform one or all of the steps of any methods or claims set forth herein when such program is run, for example, on a cable modem or other CPE and the like, and that such program may be embodied on a tangible computer readable recordable storage medium. For example, firmware that executes on a cable modem or other CPE is used to control the blowing of the fusible links; such firmware may be upgraded on the cable modem or other CPE from the head end. As used herein, including the claims, unless it is unambiguously apparent from the context that only server software is being referred to, a "server" includes a physical data processing system (for example, system 700 as shown in FIG. 7) running one or more server programs. It will be understood that such a physical server may or may not include a display, keyboard, or other input/output components. Furthermore, as used herein, including the claims, a "router" includes a networking device with both software and hardware tailored to the tasks of routing and forwarding information.

Furthermore, it should be noted that any of the methods described herein can include an additional step of providing a system comprising distinct software modules embodied on one or more tangible computer readable storage media. All the modules (or any subset thereof) can be on the same medium, or each can be on a different medium, for example. The modules can include any or all of the components shown in the figures (e.g. software or firmware module to implement pertinent aspects of element 806; may be upgraded from head end). The method steps can then be carried out using the distinct software modules of the system, as described above, executing on one or more hardware processors. Further, a computer program product can include a tangible computer-readable recordable storage medium with code adapted to be executed to carry out one or more method steps described herein, including the provision of the system with the distinct software modules.

Accordingly, it will be appreciated that at least a portion of one or more embodiments of the invention can include a computer program including computer program code means adapted to perform one or all of the steps of any methods or claims set forth herein when such program is implemented on a processor, and that such program may be embodied on a tangible computer readable recordable storage medium. Further, at least a portion of one or more embodiments of the present invention can include a processor including code adapted to cause the processor to carry out one or more steps of methods or claims set forth herein, together with one or more apparatus elements or features as depicted and described herein.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. An apparatus comprising:
an input port;
an output port;
a low-pass filter connected between said input port and said output port;
a bandpass filter;
an inverter structure connected in series with said bandpass filter, said series-connected inverter structure and bandpass filter being connected in parallel with said low-pass filter between said input port and said output port, said inverter structure in turn comprising:
a transmission line; and
an inverter connected in parallel with said transmission line by at least one fusible link without the use of any switch; and
a controller coupled to said at least one fusible link;
wherein said inverter structure, said bandpass filter, and said at least one fusible link, are configured, and wherein said controller is configurable, such that signals of a first frequency range, equal to a passband of said low-pass filter, are passed from said input port to said output port under a first condition when said at least one fusible link is intact, and such that signals of a second frequency range, equal to said passband of said low-pass filter plus a passband of said bandpass filter, are passed from said input port to said output port under a second condition when said at least one fusible link is caused to be blown by said controller.

2. The apparatus of claim 1, wherein said controller has instructions stored therein in a non-transitory manner, which instructions configure said controller to cooperate with said inverter structure, said bandpass filter, and said at least one fusible link, such that signals of said first frequency range, equal to said passband of said low-pass filter, are passed from said input port to said output port under said first condition when said at least one fusible link is intact, and such that signals of said second frequency range, equal to said passband of said low-pass filter plus said passband of said bandpass filter, are passed from said input port to said output port under said second condition when said at least one fusible link is caused to be blown by said controller.

3. The apparatus of claim 1, wherein:
said bandpass filter comprises a first bandpass filter;
said inverter structure comprises a first inverter structure;
said transmission line comprises a first transmission line;
said inverter comprises a first inverter; and
said at least one fusible link comprises a first at least one fusible link;
further comprising:
a second bandpass filter;
a second inverter structure connected in series with said second bandpass filter, said series-connected second inverter structure and second bandpass filter being connected in parallel with said low-pass filter and said series-connected first inverter structure and first bandpass filter between said input port and said output port, said second inverter structure in turn comprising:
a second transmission line; and
a second inverter connected in parallel with said second transmission line by a second at least one fusible link without the use of any switch;
wherein said controller is also coupled to said second at least one fusible link; and
wherein said first and second inverter structures, said bandpass filter, and said first and second at least one fusible links are further configured, and wherein said controller is further configurable, such that signals of said first frequency range, equal to a passband of said low-pass filter, are passed from said input port to said output port under a first condition when said first and second least one fusible links are intact; such that signals of said second frequency range, equal to said passband of said low-pass filter plus said passband of said first bandpass filter, are passed from said input port to said output port under said second condition when said first at least one fusible link is caused to be blown by said controller; and such that signals of a third frequency range, equal to said passband of said low-pass filter plus said passbands of said first and second bandpass filters, are passed from said input port to said output port under a third condition when said first at least one fusible link and said second at least one fusible link are caused to be blown by said controller.

4. The apparatus of claim 1, wherein said first and second frequency ranges are radio frequencies.

5. The apparatus of claim 1, wherein said first frequency range is five to forty-two MHz and wherein said second frequency range is five to eighty-five MHz.

6. The apparatus of claim 1, wherein:
said apparatus comprises a data over cable system interface standard (DOCSIS) compliant cable modem; and
said signals of said first and second frequency ranges comprise upstream signals from said data over cable system interface standard (DOCSIS) compliant cable modem into said cable television network.

7. An apparatus comprising:
an input port;
an output port;
a full-band low-pass filter connected between said input port and said output port;
N bandpass filters, N being an integer at least equal to one;
N inverters connected in series with said N bandpass filters by N at least one fusible links without the use of any switch, said N series-connected inverters and bandpass filters being connected in parallel with said full-band low-pass filter between said input port and said output port; and
a controller coupled to said N at least one fusible links;
wherein said N inverters, said N bandpass filters, and said N at least one fusible links are configured, and wherein said controller is configurable, such that signals of a first frequency range, equal to a passband of said full-band low-pass filter less a combined passband of said N bandpass filters, are passed from said input port to said output port under a first condition when said N at least one fusible links are intact, and such that signals of a second frequency range, equal to said passband of said full-band low-pass filter, are passed from said input port to said output port under a second condition when said N at least one fusible links are caused to be blown by said controller.

8. The apparatus of claim 7, wherein said controller has instructions stored therein in a non-transitory manner, which instructions configure said controller to cooperate with said N inverters, said N bandpass filters, and said N at least one fusible links, such that signals of said first frequency range, equal to said passband of said full-band low-pass filter less said combined passband of said N bandpass filters, are passed from said input port to said output port under said first condition when said N at least one fusible links are intact, and such that signals of a second frequency range, equal to said passband of said full-band low-pass filter, are passed from said input port to said output port under said second condition when said N at least one fusible links are caused to be blown by said controller.

9. The apparatus of claim 7, wherein N=1.

10. The apparatus of claim 7, wherein N=2, and wherein said N inverters, said N bandpass filters, and said N at least one fusible links are further configured, and wherein said controller is further configurable, such that signals of a third frequency range, equal to a passband of said full-band low-pass filter less a passband of one of said N bandpass filters, are passed from said input port to said output port under a third condition when one of said N at least one fusible links are intact, and another of said N at least one fusible links are caused to be blown by said controller.

11. The apparatus of claim 7, wherein said first and second frequency ranges are radio frequencies.

12. The apparatus of claim 11, wherein said first frequency range is five to forty-two MHz and wherein said second frequency range is five to eighty-five MHz.

13. The apparatus of claim 7, wherein:
said apparatus comprises a data over cable system interface standard (DOCSIS) compliant cable modem; and
said signals of said first and second frequency ranges comprise upstream signals from said data over cable system interface standard (DOCSIS) compliant cable modem into said cable television network.

14. A method comprising the steps of:
providing a cable modem in a premises;
operating said cable modem in a first mode with a first upstream passband at least in part by:
passing a first portion of an upstream input signal through a low-pass filter;
splitting a second portion of said upstream input signal into a first sub-portion passed through a transmission line and a second sub-portion passed through an inverter connected in parallel with said transmission line by said at least one fusible link, said transmission line and said inverter together forming an inverter structure, said inverter structure being in series with a bandpass filter; and
rejoining said first and inverted second sub-portions of said second portion to cancel said second portion;
causing at least one fusible link in said cable modem to blow, to in turn cause said cable modem to upgrade to a second mode with a second upstream passband, greater than said first upstream passband, without use of any switch; and
operating said cable modem in said second mode at least in part by:
passing said first portion of said upstream input signal through said low-pass filter;
passing said second portion of said upstream input signal through said transmission line and said bandpass filter, said at least one fusible link now being blown so that said transmission line and said bandpass filter are in series; and
adding outputs of said low-pass filter and said bandpass filter.

15. The method of claim 14, wherein:
said bandpass filter comprises a first bandpass filter;
said inverter comprises a first inverter;
said transmission line comprises a first transmission line;
said inverter structure comprises a first inverter structure; and
said at least one fusible link comprises a first at least one fusible link;
said step of operating said cable modem in said first mode comprises:
passing said first portion of said upstream input signal through said low-pass filter;
splitting said second portion of said upstream input signal into said first sub portion passed through said first transmission line and said second sub-portion passed through said first inverter connected in parallel with said first transmission line by said first at least one fusible link;
rejoining said first and inverted second sub-portions of said second portion to cancel said second portion;

splitting a third portion of said upstream input signal into a third sub-portion passed through a second transmission line and a fourth sub-portion passed through a second inverter connected in parallel with said second transmission line by a second at least one fusible link, said second transmission line and said second inverter together forming a second inverter structure, said second inverter structure being in series with a second bandpass filter; and rejoining said third and inverted fourth sub-portions of said third portion to cancel said third portion;

said step of operating said cable modem in said second mode comprises:

passing said first portion of said upstream input signal through said low-pass filter;

passing said second portion of said upstream input signal through said first transmission line, said first at least one fusible link now being blown so that said first transmission line and said first bandpass filter are in series;

passing said third portion of said upstream input signal through said second transmission line, said second at least one fusible link now being blown so that said second transmission line and said second bandpass filter are in series; and adding outputs of said low-pass filter and said first and second bandpass filters;

further comprising operating said cable modem in a third mode by:

passing said first portion of said upstream input signal through said low-pass filter;

passing said second portion of said upstream input signal through said first transmission line in, said first at least one fusible link now being blown so that said first transmission line and said first bandpass filter are in series;

splitting said third portion of said upstream input signal into said third sub-portion passed through said second transmission line and said fourth sub-portion passed through said second inverter connected in parallel with said second transmission line by said second at least one fusible link, said second transmission line and said second inverter together forming said second inverter structure, said second inverter structure being in series with said second bandpass filter;

rejoining said third and inverted fourth sub-portions of said third portion to cancel said third portion; and adding outputs of said low-pass filter and said first bandpass filter.

16. A method comprising the steps of:
providing a cable modem in a premises, said cable modem comprising at least one fusible link which comprises one of N at least one fusible links, N being an integer at least equal to one; and operating said cable modem in said first mode with a first upstream passband at least in part by:

passing a first portion of an upstream input signal through a full-band low-pass filter;

passing a second portion of said upstream input signal through N inverters connected in series with N bandpass filters by said N at least one fusible links; and adding outputs of said full-band low-pass filter and said N bandpass filters to obtain an output having a bandwidth equal to a passband of said full-band low-pass filter less a combined passband of said N bandpass filters;

causing said at least one fusible link in said cable modem to blow, to in turn cause said cable modem to upgrade to a second mode with a second upstream passband, greater than said first upstream passband, without use of any switch; and operating said cable modem in said second mode at least in part by passing said upstream input signal through said full-band low-pass filter.

17. The method of claim 16, further comprising operating said cable modem in a third mode by:

passing a third portion of an upstream input signal through a full-band low-pass filter; and passing a fourth portion of said upstream input signal through N-1 inverters connected in series with N-1 bandpass filters by N-1 of said N at least one fusible links; and adding outputs of said full-band low-pass filter and said N-1 bandpass filters to obtain an output having a bandwidth equal to a passband of said full-band low-pass filter less a combined passband of said N-1 bandpass filters.

18. The method of claim 14, wherein:
in said step of operating said cable modem in said first mode with said first upstream passband, said first upstream passband is a first radio frequency passband; and in said step of causing said at least one fusible link in said cable modem to blow, to in turn cause said cable modem to upgrade to said second mode with said second upstream passband, said second upstream passband is a second radio frequency passband.

19. The method of claim 18, wherein:
in said step of operating said cable modem in said first mode with said first upstream passband, said first upstream passband is five to forty-two MHz; and in said step of causing said at least one fusible link in said cable modem to blow, to in turn cause said cable modem to upgrade to said second mode with said second upstream passband, said second upstream passband is five to eighty-five MHz.

20. The method of claim 14, wherein:
in said step of providing said cable modem, said cable modem comprises a data over cable system interface standard (DOCSIS) compliant cable modem; and said step of operating said cable modem in said first mode with said first upstream passband comprises passing signals through said first upstream passband from said cable modem into a cable television network;

further comprising operating said cable modem in said second mode by passing signals through said second upstream passband from said cable modem into said cable television network.

* * * * *